(12) United States Patent
Lee et al.

(10) Patent No.: US 11,035,908 B2
(45) Date of Patent: *Jun. 15, 2021

(54) DISPLAY DEVICE INCLUDING FLEXIBLE PRINTED CIRCUIT BOARD AND FOR DETECTING SEPARATION OF THE FLEXIBLE PRINTED CIRCUIT BOARD

(71) Applicant: SAMSUNG DISPLAY CO., LTD., Yongin-si (KR)

(72) Inventors: Hee Gwon Lee, Asan-si (KR); Sung Un Park, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/837,099

(22) Filed: Apr. 1, 2020

(65) Prior Publication Data

US 2020/0249283 A1 Aug. 6, 2020

Related U.S. Application Data

(63) Continuation of application No. 16/118,721, filed on Aug. 31, 2018, now Pat. No. 10,656,220.

(30) Foreign Application Priority Data

Apr. 5, 2018 (KR) .................. 10-2018-0039481

(51) Int. Cl.
*G06F 3/041* (2006.01)
*G01R 31/70* (2020.01)
(Continued)

(52) U.S. Cl.
CPC ............. *G01R 31/70* (2020.01); *G06F 3/044* (2013.01); *G06F 3/0416* (2013.01);
(Continued)

(58) Field of Classification Search
CPC ... G01R 31/70; H01L 27/3276; H01L 27/323; H01L 51/5253; H05K 1/189;
(Continued)

(56) References Cited

U.S. PATENT DOCUMENTS

2016/0066409 A1 3/2016 Kwon et al.
2016/0306488 A1 10/2016 Kim et al.
(Continued)

FOREIGN PATENT DOCUMENTS

KR 10-2017-0103410 9/2017

*Primary Examiner* — Adam R. Giesy
(74) *Attorney, Agent, or Firm* — F. Chau & Associates, LLC

(57) ABSTRACT

A display device includes a display panel, a conductive layer disposed under the display panel, a first flexible printed circuit board including a first substrate portion having a side connected to the display panel, a bending portion extending from the first substrate portion, and a second substrate portion extending from the bending portion and disposed under the conductive layer. The second substrate portion includes a first sensing pattern. The display device further includes a coupling portion disposed between the second substrate portion and the conductive layer and coupling the second substrate portion and the conductive layer. The display device further includes a driver chip electrically connected to the first sensing pattern and configured to detect whether the coupling portion has been separated from either the second substrate portion or the conductive layer based on a capacitance that depends on a distance between the conductive layer and the first sensing pattern.

20 Claims, 20 Drawing Sheets

(51) Int. Cl.
  *H01L 27/32*   (2006.01)
  *H05K 1/18*   (2006.01)
  *H05K 1/02*   (2006.01)
  *G06F 3/044*   (2006.01)
  *H01L 51/52*   (2006.01)
  *H05K 1/14*   (2006.01)
  *H01R 12/78*   (2011.01)
  *H01R 12/61*   (2011.01)

(52) U.S. Cl.
  CPC ........ *H01L 27/323* (2013.01); *H01L 27/3276* (2013.01); *H01L 51/5253* (2013.01); *H05K 1/028* (2013.01); *H05K 1/181* (2013.01); *H05K 1/189* (2013.01); *G06F 2203/04102* (2013.01); *G06F 2203/04105* (2013.01); *H01R 12/61* (2013.01); *H01R 12/78* (2013.01); *H05K 1/147* (2013.01); *H05K 2201/056* (2013.01); *H05K 2201/10128* (2013.01); *H05K 2201/10151* (2013.01)

(58) Field of Classification Search
  CPC .. H05K 1/028; H05K 1/181; H05K 2201/056; H05K 2201/10128; H05K 1/147; H05K 2201/10151; H05K 1/162; H05K 2201/09781; H05K 1/0268; G06F 3/0416; G06F 3/044; G06F 2203/04105; G06F 2203/04102; G06F 3/04164; G06F 3/0443; G06F 3/0446; G06F 2203/04111; G06F 3/0412; G06F 3/0414; H01R 12/78; H01R 12/61
  See application file for complete search history.

(56) References Cited

U.S. PATENT DOCUMENTS

2019/0310302 A1   10/2019   Lee
2019/0339141 A1   11/2019   Gisby et al.

DISPLAY DEVICE INCLUDING FLEXIBLE PRINTED CIRCUIT BOARD AND FOR DETECTING SEPARATION OF THE FLEXIBLE PRINTED CIRCUIT BOARD

CROSS-REFERENCE TO RELATED APPLICATIONS

This application is a continuation of U.S. patent application Ser. No. 16/118,721 filed on Aug. 31, 2018, which claims priority under 35 U.S.C. § 119 to Korean Patent Application No. 10-2018-0039481, filed on Apr. 5, 2018, in the Korean Intellectual Property Office, the disclosures of which are incorporated by reference herein in its entireties.

TECHNICAL FIELD

The present disclosure relates to a display device including a flexible printed circuit board (FPCB), and more particularly, to a display device including a flexible printed circuit board and for detecting separation of the flexible printed circuit board.

DISCUSSION OF THE RELATED ART

Various display devices such as liquid crystal displays and organic light emitting displays are currently under development.

A display device may include a display panel and a flexible printed circuit board (FPCB) connected to the display panel, and a part of the FPCB may be bent and fixed to the display panel.

As applications and functions of display devices become diversified, display devices may include a sensing function to interact with a user, in addition to a function of displaying an image. For example, a recent display device may include not only a display panel and an FPCB but also a touch sensing unit for sensing a touch input of a user.

Various elements may be located on the FPCB. The FPCB that is fixed to the display panel can be separated from the display panel due to the elastic restoring force of the FPCB. Accordingly, of the elements located on the FPCB, an element that should be coupled to the display panel can also be separated from the display panel.

SUMMARY

According to an exemplary embodiment of the present invention, a display device includes a display panel, a conductive layer disposed under the display panel, a first flexible printed circuit board including a first substrate portion having a side connected to the display panel, a bending portion extending from the first substrate portion, and a second substrate portion extending from the bending portion and disposed under the conductive layer. The first substrate portion overlaps the display panel, and the second substrate portion includes a first sensing pattern. The display device further includes a coupling portion disposed between the second substrate portion and the conductive layer and coupling the second substrate portion and the conductive layer together. The coupling portion is adjacent to the first sensing pattern. The display device further includes a driver chip electrically connected to the first sensing pattern and configured to detect whether the coupling portion has been separated from either the second substrate portion or the conductive layer based on a capacitance that depends on a distance between the conductive layer and the first sensing pattern.

In an exemplary embodiment of the present invention, the first sensing pattern at least partially surrounds the coupling portion.

In an exemplary embodiment of the present invention, the first sensing pattern includes a plurality of sub-sensing patterns disposed adjacent to the coupling portion. The plurality of sub-sensing patterns are spaced apart from each other.

In an exemplary embodiment of the present invention, the driver chip is disposed on the second substrate portion.

In an exemplary embodiment of the present invention, the display device further includes a touch sensing unit disposed on the display panel, and a second flexible printed circuit board including a first side connected to the touch sensing unit and a second side connected to the second substrate portion.

In an exemplary embodiment of the present invention, the driver chip is configured to control an operation of the touch sensing unit.

In an exemplary embodiment of the present invention, the coupling portion includes a conductive adhesive tape.

In an exemplary embodiment of the present invention, the first flexible printed circuit board further includes a ground portion, and the coupling portion contacts the ground portion and the conductive layer.

In an exemplary embodiment of the present invention, the display device further includes a main circuit board connected to the first flexible printed circuit board. The main circuit board is electrically connected to the driver chip.

In an exemplary embodiment of the present invention, the main circuit board is configured to control the display panel to perform a predetermined operation when the coupling portion is separated from either the conductive layer or the second substrate portion.

In an exemplary embodiment of the present invention, the display device further includes a pressure sensor disposed between the second substrate portion and the conductive layer, coupled to the second substrate portion and the conductive layer, and spaced apart from the coupling portion. The second substrate portion further includes a second sensing pattern disposed adjacent to the pressure sensor and electrically connected to the driver chip, and the driver chip is further configured to detect whether the pressure sensor has been separated from either the second substrate portion or the conductive layer based on a capacitance that is dependent on a distance between the conductive layer and the second sensing pattern.

In an exemplary embodiment of the present invention, the first flexible printed circuit board further includes a first connection line electrically connected to the first sensing pattern and the driver chip, and a second connection line spaced apart from the first connection line and electrically connected to the second sensing pattern and the driver chip.

In an exemplary embodiment of the present invention, the first flexible printed circuit board further includes a sensor connection line electrically connected to the pressure sensor and the driver chip and spaced apart from the first connection line and the second connection line.

In an exemplary embodiment of the present invention, the second sensing pattern at least partially surrounds the pressure sensor.

In an exemplary embodiment of the present invention, the second sensing pattern includes a plurality of sub-sensing patterns disposed adjacent to the pressure sensor. The plurality of sub-sensing patterns are spaced apart from each other.

According to an exemplary embodiment of the present invention, a display device includes a display panel, a conductive layer disposed on the display panel, a flexible printed circuit board including a first substrate portion having a side connected to the display panel, a second substrate portion disposed under the conductive layer, and a bending portion connecting the first substrate portion and the second substrate portion to each other. The first substrate portion overlaps the display panel, and the second substrate portion includes a sensing pattern. The display device further includes a pressure sensor disposed between the second substrate portion and the conductive layer. The pressure sensor is adjacent to the sensing pattern, and is coupled to the second substrate portion and the conductive layer. The display device further includes a driver chip electrically connected to the sensing pattern, configured to detect whether the pressure sensor has been separated from either the second substrate portion or the conductive layer based on a capacitance that is dependent upon a distance between the conductive layer and the sensing pattern, and disposed on the second substrate portion.

In an exemplary embodiment of the present invention, the display device further including a touch sensing unit disposed on the display panel. The driver chip is electrically connected to the touch sensing unit and is configured to control an operation of the touch sensing unit.

In an exemplary embodiment of the present invention, the driver chip is electrically connected to the pressure sensor and is configured to control an operation of the pressure sensor.

According to an exemplary embodiment of the present invention, a flexible printed circuit board includes a first substrate portion connected to an electronic device, a bending portion extending from the first substrate portion, a second substrate portion extending from the bending portion and including a ground portion, a first sensing pattern disposed adjacent to the ground portion and configured to detect a capacitance, a driver chip connection portion spaced apart from the ground portion and the first sensing pattern, and a first connection line electrically connecting the first sensing pattern and the driver chip connection portion to each other.

In an exemplary embodiment of the present invention, the second substrate portion further includes a sensor connection portion spaced apart from the ground portion and the driver chip connection portion. The second substrate portion further includes a second sensing pattern disposed adjacent to the sensor connection portion, spaced apart from the first sensing pattern, and configured to detect a capacitance. The second substrate portion additionally includes a sensor connection line electrically connected to the sensor connection portion and the driver chip connection portion. The second substrate portion further includes a second connection line electrically connected to the second sensing pattern and the driver chip connection portion.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Figure 1:
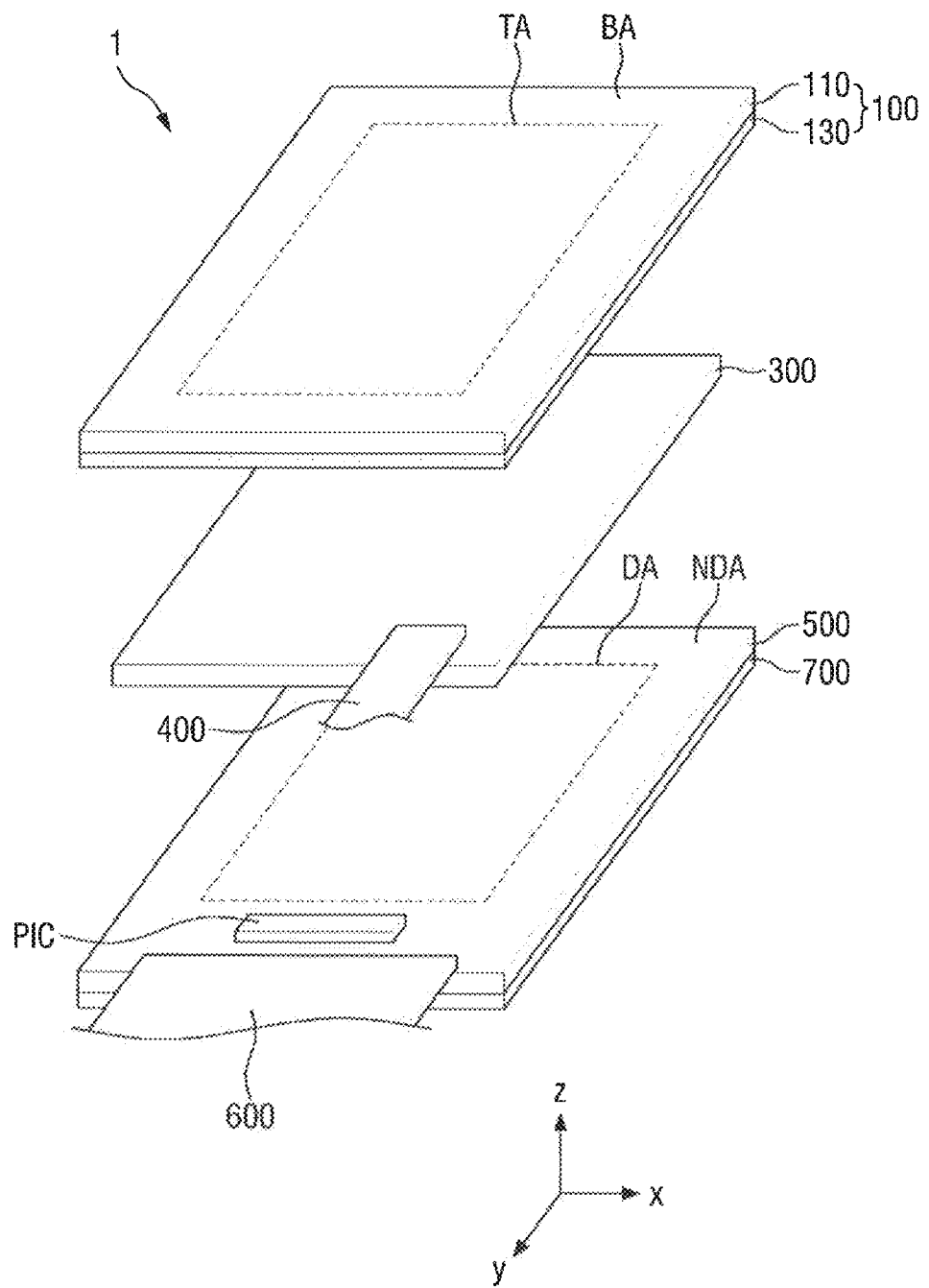
FIG. 1 is an exploded perspective view of a display device according to an exemplary embodiment of the present invention.

In describing exemplary embodiments of the present invention illustrated in the drawings, specific terminology may be employed for sake of clarity. The present invention may, however, be embodied in many different forms and should not be construed as being limited to the embodiments set forth herein. Rather, these embodiments are provided so that this disclosure will be thorough and complete and will fully convey the concept of the inventive concept to those skilled in the art. Like reference numerals may refer to like elements throughout the specification and the drawings.

It will be understood that when an element or layer is referred to as being "on", "connected to" or "coupled to" another element or layer, it can be directly on, connected or coupled to the other element or layer, or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, exemplary embodiments of the present invention will be described with reference to the accompanying drawings.

Figure 2:
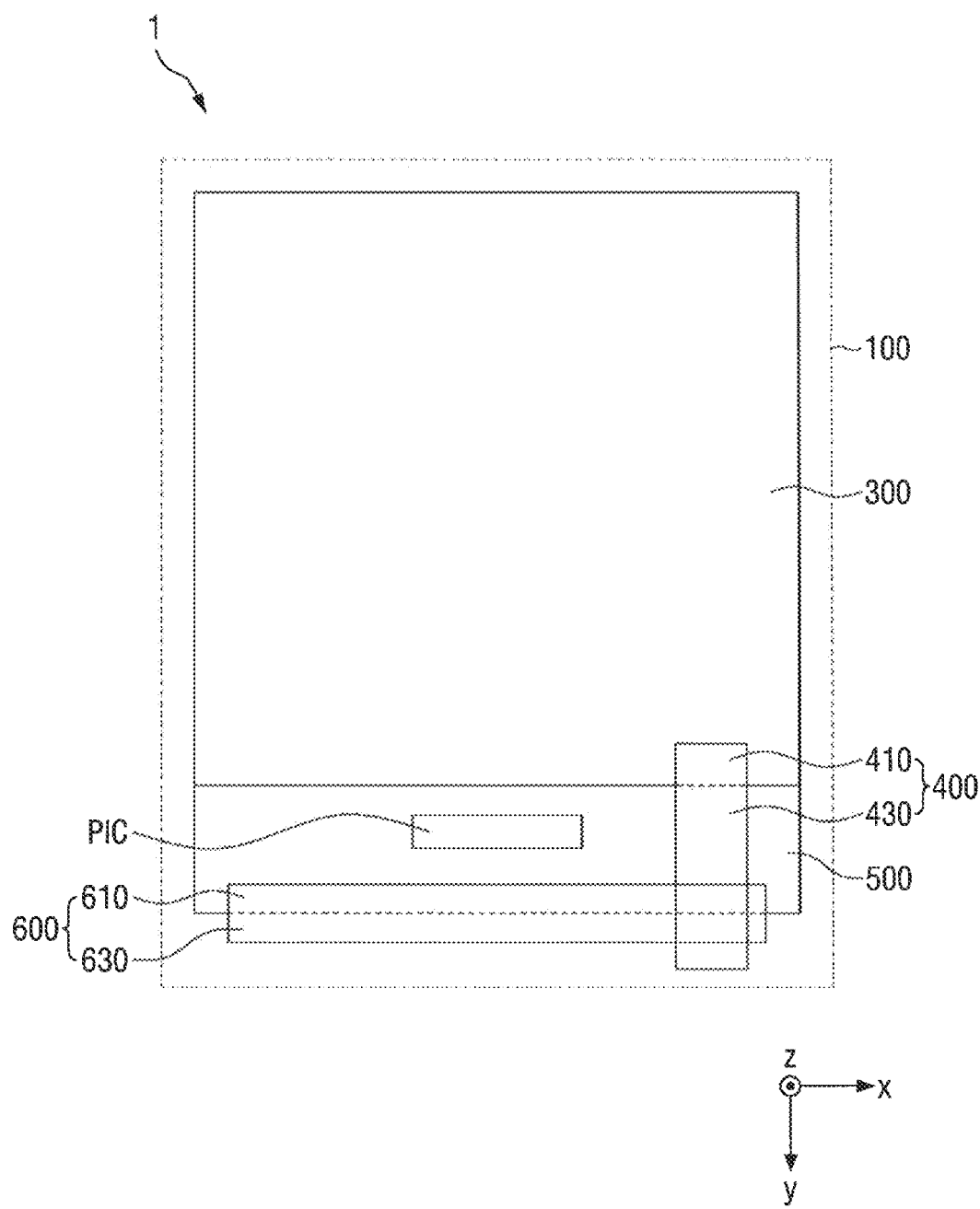
FIG. 2 is a plan view of a display device according to an exemplary embodiment of the present invention.
Figure 3:
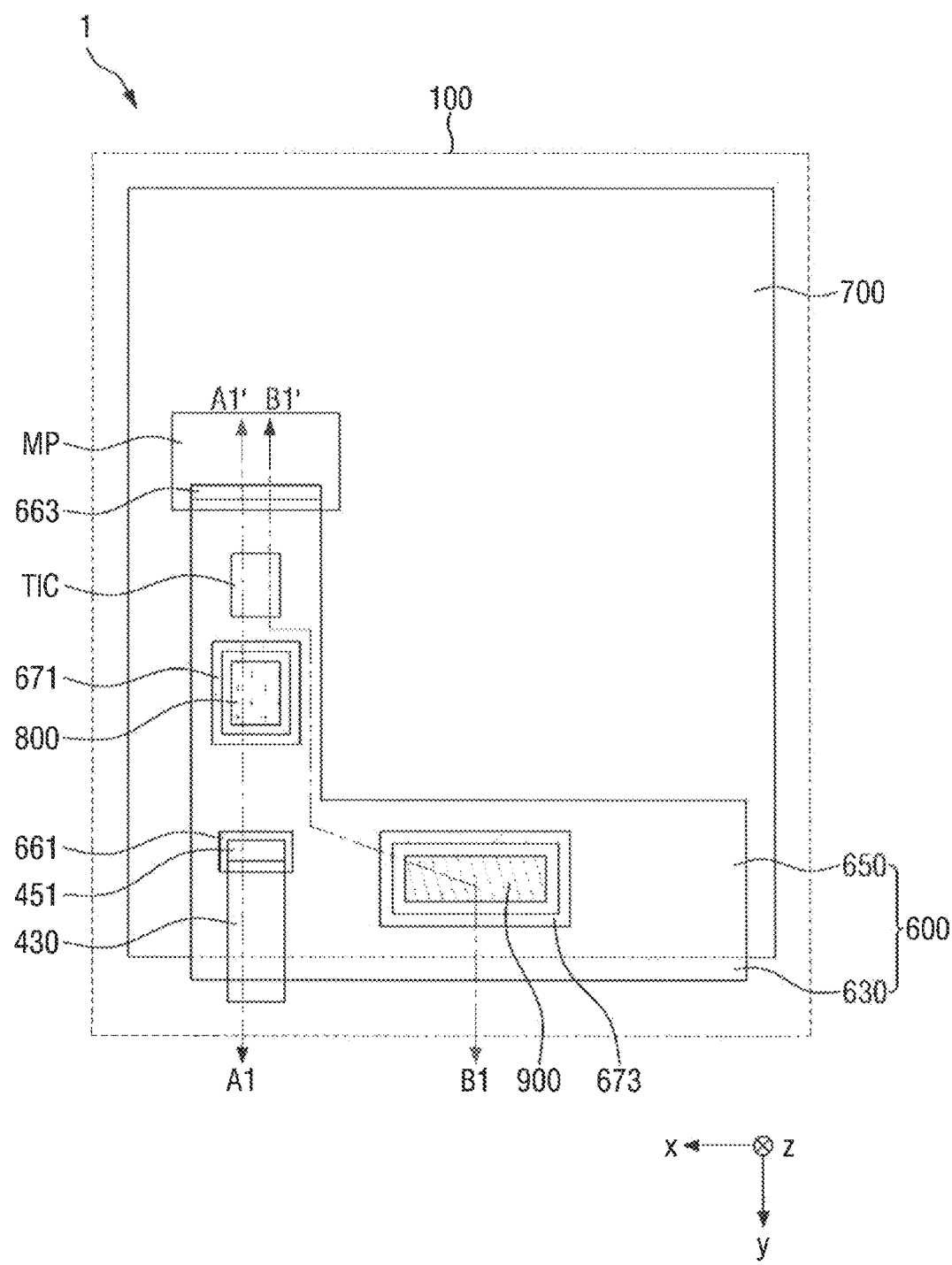
FIG. 3 is a rear view of a display device according to an exemplary embodiment of the present invention.
Figure 4:
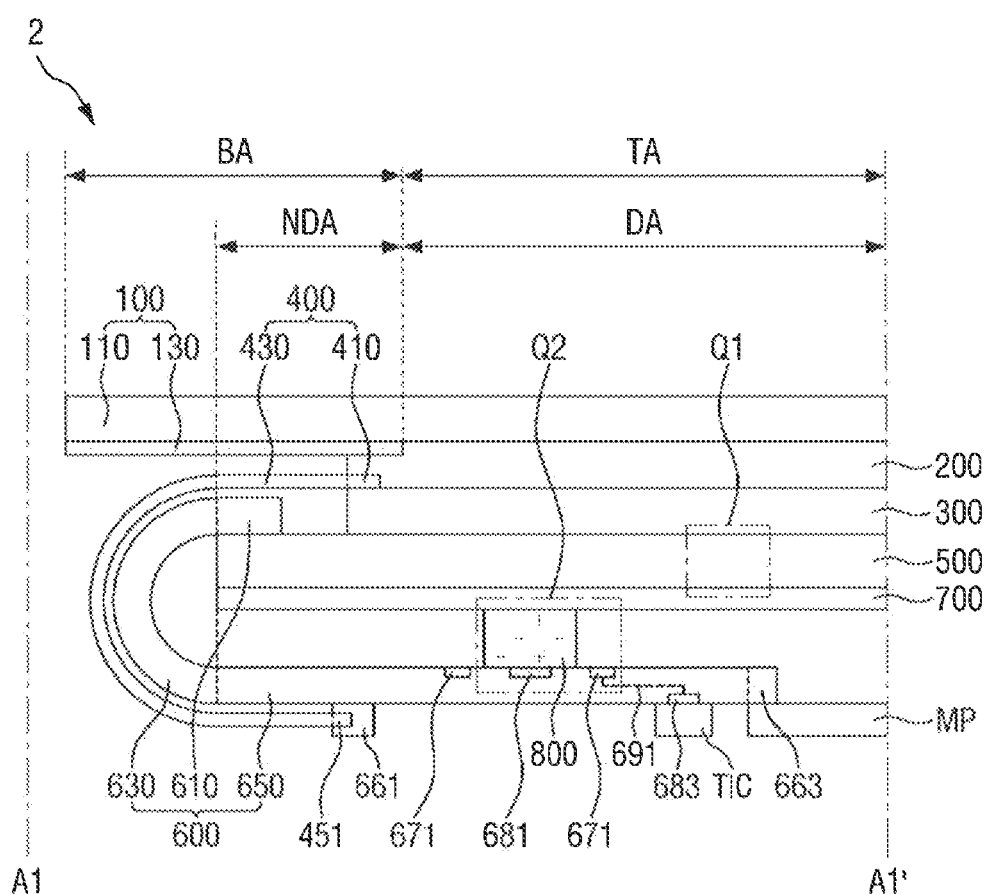
FIG. 4 is a cross-sectional view taken along line A1-A1' of FIG. 3 according to an exemplary embodiment of the present invention.
Figure 5:
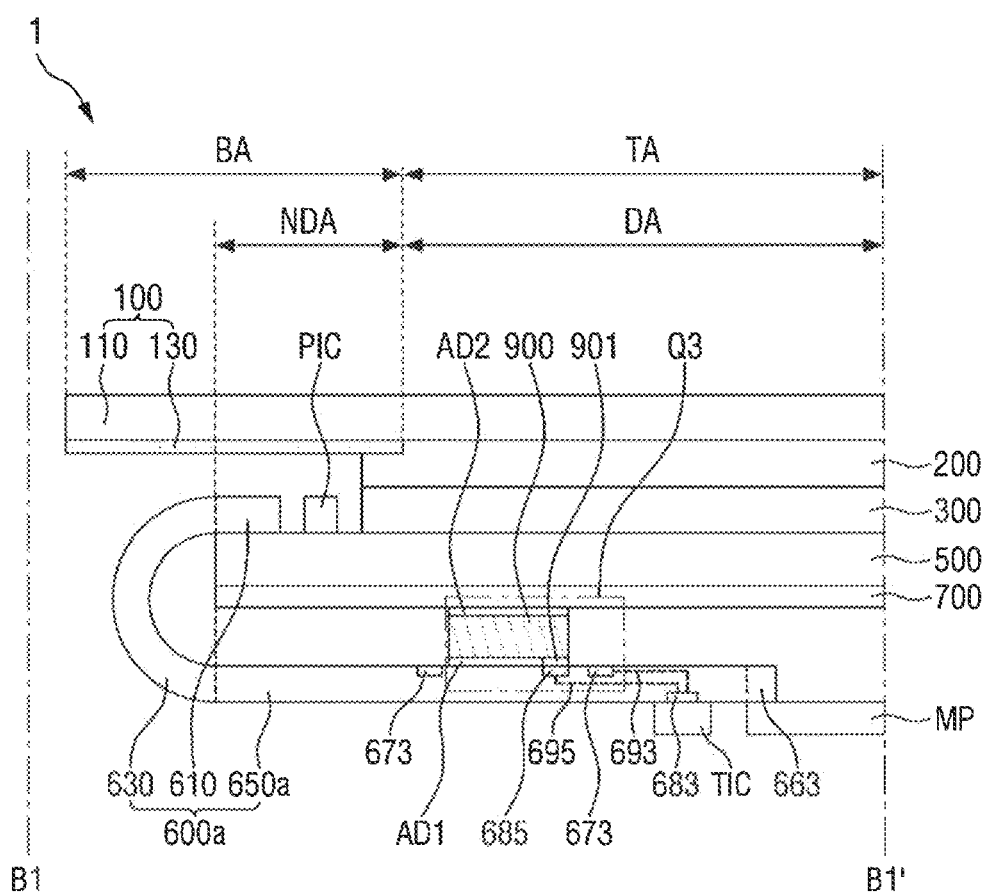
FIG. 5 is a cross-sectional view taken along line B1-B1' of FIG. 3 according to an exemplary embodiment of the present invention.

FIG. 1 is an exploded perspective view of a display device 1 according to an exemplary embodiment of the present invention. FIG. 2 is a plan view of the display device 1 according to an embodiment of the present invention. FIG. 3 is a rear view of the display device 1 according to an exemplary embodiment of the present invention. FIG. 4 is a cross-sectional view taken along line A1-A1' of FIG. 3 according to an exemplary embodiment of the present invention. FIG. 5 is a cross-sectional view taken along line B1-B1' of FIG. 3 according to an exemplary embodiment of the present invention.

Referring to FIGS. 1 through 5, the display device 1 according to an exemplary embodiment of the present invention includes a display panel 500, a first flexible printed circuit board (FPCB) 600 connected to the display panel 500, a conductive layer 700 located on the display panel 500, a driver chip TIC, a coupling portion 800, and a pressure sensor 900. As an example, the conductive layer 700 may be located under the display panel 500. The display device 1 may further include a touch sensing unit 300 located on the display panel 500, a second FPCB 400 connected to the touch sensing unit 300, and a window structure 100.

The display panel 500 may be rectangular in a plan view. The display panel 500 may include both short sides extending in a first direction x and both long sides extending in a second direction y intersecting the first direction x. For example, corners at which the long sides and the short sides of the display panel 500 meet may be at substantially right angles. However, the present invention is not limited thereto. For example, the corners of the display panel 500 may be curved or may be chamfered to reduce the risk of breakage or cracking. The planar shape of the display panel 500 is not limited to the above examples and may also be a circular shape or other quadrangular shapes.

The display panel 500 includes a display area DA and a non-display area NDA. The display area DA is an area where an image is displayed, and the non-display area NDA is an area where an image is not displayed. In an exemplary embodiment of the present invention, the non-display area NDA may be located around the display area DA and may at least partially surround the display area DA. However, the present invention is not limited thereto, and the non-display area NDA may completely surround the display area DA.

In an exemplary embodiment of the present invention, the display panel 500 may be a display panel including a self-luminous element. In an exemplary embodiment of the present invention, the self-luminous element may be at least one of an organic light emitting diode, a quantum dot light emitting diode (LED), and an inorganic material-based ultra-small LED (e.g., a micro LED).

For ease of description, a case where the self-luminous element is an organic light emitting diode will hereinafter be described as an example, and a detailed description of each element of the display panel 500 will be described later with reference to FIG. 6.

A panel driver chip PIC may be located on the display panel 500 in the non-display area NDA. The panel driver chip PIC may generate a driving signal for driving the display panel 500, and the generated driving signal may be provided to the display panel 500.

In an exemplary embodiment of the present invention, the panel driver chip PIC may be mounted on the display panel 500. For example, when a base substrate of the display panel 500 is made of glass, the panel driver chip PIC may be mounted on the base substrate in the form of a chip on glass (COG). In addition, when the base substrate is made of plastic, the panel driver chip PIC may be mounted on the base substrate in the form of a chip on plastic (COP). In an exemplary embodiment of the present invention, the panel driver chip PIC may be located on the first FPCB 600 or on a main circuit board MP. A case where the panel driver chip PIC is mounted on the display panel 500 in the non-display area NDA will hereinafter be described as an example.

The window structure 100 may be located on the display panel 500.

The window structure 100 may be located on the display panel 500 to protect the display panel 500 from external impacts, scratches, and the like. The window structure 100 may include a light transmitting area TA and a light blocking area BA. The light transmitting area TA is an area through which light is transmitted, and an image from the display panel 500 may be transmitted through the light transmitting area TA and provided to a user. The light blocking area BA may be an area for blocking light transmission. In an exemplary embodiment of the present invention, the light blocking area BA may be located around the light transmitting area TA and may at least partially surround the light transmitting area TA. In an exemplary embodiment present invention, the light transmitting area TA may overlap the display area DA of the display panel 500, and the light blocking area BA may overlap the non-display area NDA of the display panel 500. For example, the light blocking area BA may hide the non-display area NDA of the display panel 500. As an additional example, the light transmitting area TA may have a shape that corresponds to the display area DA, and the light blocking area BA may have a shape that corresponds to the non-display area NDA.

The window structure 100 may have a stacked structure including a window 110 and a light shielding member 130.

The window 110 may be made of, for example, glass, sapphire, plastic, or the like. The window 110 may be rigid. However, the present invention is not limited thereto, and the window 100 may be flexible or partially flexible.

The light shielding member 130 may be located on a surface of the window 110 which faces the display panel 500. The light shielding member 130 may block light from the light blocking area BA of the window structure 100. In an exemplary embodiment of the present invention, the light shielding member 130 may be made of a colored organic layer and may be formed on the surface of the window 110 by, for example, a coating method or a printing method.

The touch sensing unit 300 may be disposed between the display panel 500 and the window structure 100.

The touch sensing unit 300 may sense the position of a touch input from the outside (e.g., a user). In an exemplary embodiment of the present invention, the touch sensing unit 300 may obtain the coordinates of a touch input point using a capacitive method. In the capacitive method, coordinate information of a touched point may be obtained in a self-capacitance or mutual capacitance manner. For ease of description, a case where the touch sensing unit 300 has a mutual capacitive structure will hereinafter be described as an example.

In an exemplary embodiment of the present invention, the touch sensing unit 300 may be integrated with the display panel 500. For example, touch electrodes of the touch sensing unit 300 may be located directly on an encapsulation portion, of the display panel 500. In addition, in an exemplary embodiment of the present invention, the touch sensing unit 300 may be formed separately from the display panel 500 and may be coupled to the display panel 500 by a separate bonding layer.

The touch sensing unit 300 and the window structure 100 may be coupled by a transparent bonding layer 200 such as an optically clear adhesive (OCA) or an optically clear resin (OCR).

The conductive layer 700 may be disposed under the display panel 500. In an exemplary embodiment of the present invention, the conductive layer 700 may be a metal layer and may include various materials capable of shielding electromagnetic waves and having thermal conductivity. For example, the conductive layer 700 may be a heat dissipation layer or an electromagnetic wave shielding layer. For example, the conductive layer 700 may include a metal such as copper, nickel, ferrite, and/or silver.

Although not illustrated in the drawings, a light absorbing layer may be disposed between the display panel 500 and the conductive layer 700. The light absorbing layer disposed between the display panel 500 and the conductive layer 700 may block a transmission of light and may prevent elements disposed under the display panel 500 from being visible outside the display device 1.

The first FPCB 600 may be connected to the display panel 500. The first FPCB 600 is configured to receive a signal for controlling the panel driver chip PIC and may be coupled to the display panel 500 in the non-display area NDA.

The first FPCB 600 may include a first substrate portion 610, a bending portion 630, and a second substrate portion 650. The first FPCB 600 may further include a first connection portion 661 and a second connection portion 663.

The first substrate portion 610 is a portion of the first FPCB 600 which is coupled to the display panel 500 in the non-display area NDA. The first substrate portion 610 may overlap the display panel 500 and may be coupled to a pad portion or the like, provided on the display panel 500. In an exemplary embodiment of the present invention, the first substrate portion 610 may be coupled to the pad portion by an anisotropic conductive film. In addition, the first substrate portion 610 may be coupled to the pad portion using an ultrasonic bonding method. The first substrate portion 610 may be located at a portion of the non-display area NDA which is adjacent to one short side of the display panel 500 extending along the first direction x.

The bending portion 630 is a portion extending from the first substrate portion 610. The bending portion 630 may extend from the first substrate portion 610 in the second direction y and may be bent toward a lower surface of the display panel 500 or the conductive layer 700. For example, the bending portion 630 may be bent around the display panel 500 and the conductive layer 700. For example, the bending portion 630 is a bendable portion and may be bent when the first FPCB 600 is bent. The bending portion 630 might not overlap the display panel 500.

The second substrate portion 650 is a portion extending from the bending portion 630 and may be located under the conductive layer 700. The second substrate portion 650 may include a first surface facing the conductive layer 700 when the bending portion 630 is bent and a second surface opposite the first surface.

The second substrate portion 650 may include a first sensing pattern 671, a second sensing pattern 673, a ground portion 681, a driver chip connection portion 683, a sensor connection portion 685, a first connection line 691, a second connection line 693, and a sensor connection line 695 which are spaced apart from each other.

In an exemplary embodiment of the present invention, the first sensing pattern 671, the ground portion 681, the driver chip connection portion 683, and the sensor connection portion 685 may respectively be formed as exposed conductive pads that form the surface of the second substrate portion 650. In an exemplary embodiment of the present invention, the first sensing pattern 671, the ground portion 681, the driver chip connection portion 683, and the sensor connection portion 685 may be formed on the surface of the second substrate portion 650.

The ground portion 681 is a portion electrically connected to an external circuit and is grounded. In an exemplary embodiment of the present invention, a ground signal or a ground voltage may be applied to the ground portion 681. In an exemplary embodiment of the present invention, the ground portion 681 may be located on the first surface side of the second substrate portion 650 which faces the conductive layer 700.

The driver chip connection portion 683 is a portion on which the driver chip TIC to be described later is mounted. In an exemplary embodiment of the present invention, the driver chip connection portion 683 may be located on the second surface of the second substrate portion 650 which is opposite the first surface facing the conductive layer 700.

The sensor connection portion 685 is a portion connected to a connection terminal 901 of the pressure sensor 900 to be described later. In an exemplary embodiment of the present invention, the sensor connection 685 may be located on the first surface side of the second substrate portion 650 which faces the conductive layer 700. In an exemplary embodiment of the present invention, the sensor connection portion 685 may be electrically connected to the driver chip connection portion 683 by the sensor connection line 695 and may be controlled by the driver chip TIC mounted on the driver chip connection portion 683. The sensor connection line 695 may be spaced apart from the first connection line 691 and the second connection line 693 and might not be connected to the first connection line 691 and the second connection line 693.

The first sensing pattern 671 may be spaced apart from the ground portion 681 and located adjacent to the ground portion 681 by a distance. The first sensing pattern 671 is for detecting peeling or lifting of the coupling portion 800.

For example, the peeling or lifting of the coupling portion 800 denotes that at least a part of the coupling portion 800 is separated from an element to which the coupling portion 800 is attached. As an additional example, the peeling or lifting of the coupling portion 800 denotes that at least a part of the coupling portion 800 is separated from the conductive layer 700 or that at least a part of the coupling portion 800 is separated from the second substrate portion 650.

An inspection signal (e.g., a voltage) may be provided to the first sensing pattern 671. A capacitance may be formed between the first sensing pattern 671 and the conductive layer 700. In an exemplary embodiment of the present invention, the first sensing pattern 671 may be electrically connected to the driver chip connection portion 683 by the first connection line 691. The first sensing pattern 671 may be electrically connected to the driver chip TIC mounted on the driver chip connection portion 683. The first connection line 691 may be spaced apart from the sensor connection line 695 and might not be connected to the sensor connection line 695.

In an exemplary embodiment of the present invention, the first sensing pattern 671 may be located on the first surface side of the second substrate portion 650 which faces the conductive layer 700 and may surround the ground portion 681 in a plan view. The first sensing pattern 671 may completely surround the ground portion 681. However, the present invention is not limited thereto. For example, the first sensing pattern 671 may partially surround the ground portion 681.

The second sensing pattern 673 may be spaced apart from the sensor connection portion 685 and located adjacent to the sensor connection portion 685. The second sensing pattern 673 is for detecting the peeling or lifting of the pressure sensor 900. An inspection signal (e.g., a voltage) may be transmitted to the second sensing pattern 673. A capacitance may be formed between the second sensing pattern 673 and the conductive layer 700. In an exemplary embodiment of the present invention, the second sensing pattern 673 may be electrically connected to the driver chip connection portion 683. The second sensing pattern 673 may be electrically connected to the driver chip TIC mounted on the driver chip connection portion 683. For example, the second sensing pattern 673 may be electrically connected to the driver chip connection portion 683 by the second connection line 693. The second connection line 693 and the first connection line 691 may be spaced apart from each other and might not be connected to each other. Therefore, the first sensing pattern 671 and the second sensing pattern 673 may be electrically connected to the driver chip TIC independently.

In an exemplary embodiment of the present invention, the second sensing pattern 673 may be located on the first surface side of the second substrate portion 650 which faces the conductive layer 700 and may surround the sensor connection portion 685 in a plan view. The second sensing pattern 673 may completely surround the sensor connection portion 685. However, the present invention is not limited thereto. For example, the second sensing pattern 673 may partially surround the sensor connection portion 685.

The first connection portion 661 may be located on the second substrate portion 650. In an exemplary embodiment of the present invention, the first connection portion 661 may be located on the second surface side of the second substrate portion 650 which is opposite the first surface side facing the conductive layer 700. The first connection portion 661 may be connected to the second FPCB 400 to be described later. In an exemplary embodiment of the present invention, the first connection portion 661 may be in the form of a connector. For example, when a connection portion 451 included in the second FPCB 400 is in the form of a female connector, the first connection portion 661 may be in the form of a male connector. In addition, when the connection portion 451 included in the second FPCB 400 is in the form of a male connector, the first connection portion 661 may be in the form of a female connector. However, the present invention is not limited thereto. For example, the shape of the first connection portion 661 is not limited to the description above. In an exemplary embodiment of the present invention, the first connection portion 661 may be in the form of a pad or the like.

The second connection portion 663 is a portion for receiving a signal from the outside (e.g., an external device). In an exemplary embodiment of the present invention, the second connection portion 663 may be connected to the main circuit board MP. In an exemplary embodiment of the present invention, the second connection portion 663 may be a part of the second substrate portion 650 or may be located on the second substrate portion 650. For example, the second connection portion 663 may be connected to the second substrate portion 650, or the second connection portion 663 and the second substrate portion 650 may be single body.

The main circuit board MP may be connected to the second connection portion 663. The main circuit board MP may control the overall function of the display device 1. For example, the main circuit board MP may provide image data according to the driving of the display device 1 to the panel driver chip PIC via the first FPCB 600. In addition, the main circuit board MP may receive a signal from the driver chip TIC via the first FPCB 600 and may control the driving of the display device 1 in response to the received signal.

The driver chip TIC may be mounted on the first FPCB 600. The driver chip TIC may control the operation of the touch sensing unit 300. The driver chip TIC may provide a driving signal to the touch sensing unit 300 and may receive a sensing signal generated by the touch sensing unit 300. In addition, the driver chip TIC may detect touch information (e.g., touch position, etc.) based on the received sensing signal. In an exemplary embodiment of the present invention, the driver chip TIC may be mounted on the driver chip connection portion 683 of the second substrate portion 650.

In an exemplary embodiment of the present invention, the drive chip TIC may be electrically connected to the pressure sensor 900 and may control the operation of the pressure sensor 900. The driver chip TIC may provide a driving signal to the pressure sensor 900 and may receive a sensing signal generated by the pressure sensor 900. In addition, the driver chip TIC may detect touch information (e.g., touch pressure, touch position, etc.) based on the received sensing signal.

In an exemplary embodiment of the present invention, the driver chip TIC may be electrically connected to the first sensing pattern 671 and the second sensing pattern 673. The driver chip TIC may provide an inspection signal (a voltage or the like) to each of the first sensing pattern 671 and the second sensing pattern 673, and the driver chip TIC may detect the lifting of the coupling portion 800 and/or the lifting of the pressure sensor 900 based on a result signal received in response to the inspection signal. As described above, the driver chip TIC may provide an inspection signal to each of the first sensing pattern 671 and the second sensing pattern 673 independently, and the driver chip TIC may receive a result signal from each of the first sensing pattern 671 and the second sensing pattern 673 independently.

The coupling portion 800 is a portion for coupling the second substrate portion 650 of the first flexible circuit substrate 600 and the conductive layer 700 to each other, and the coupling portion 800 may be located between the second substrate portion 650 and the conductive layer 700.

In an exemplary embodiment of the present invention, the coupling portion 800 may be made of a double-sided adhesive tape, and the double-sided adhesive tape may have conductivity. The coupling portion 800 having conductivity may contact the ground portion 681 of the second substrate portion 650 and the conductive layer 700. A ground signal (or a ground voltage) transmitted to the ground portion 681 may be provided to the conductive layer 700 via the coupling portion 800 having conductivity. For example, the conductive layer 700 may be electrically connected to the ground portion 681 and may thus be grounded. As the conductive layer 700 is grounded, noise generated by the interference between the driver chip TIC and the conductive layer 700 can be eliminated.

The coupling portion 800 may contact the ground portion 681 but might not contact the first sensing pattern 671. For example, the coupling portion 800 might not overlap the first sensing pattern 671. In a plan view, the coupling portion 800 may be spaced apart from the first sensing pattern 671 and at least partially surrounded by the first sensing pattern 671.

The pressure sensor 900 may detect the intensity (e.g., strength or force) of a touch input applied to the display device 1. For example, the pressure sensor 900 may detect a touch input applied to a surface of the window structure 100. As an additional example, the pressure sensor 900 may be of a capacitive type that may sense the intensity of a touch input by detecting a change in capacitance between upper and lower electrodes when the touch input is applied. As another example, the pressure sensor 900 may be of a resistive type that may sense the intensity of a touch input by detecting a change in resistance between electrodes when the touch input is applied. For ease of description, a case where the pressure sensor 900 is of a capacitive type will be described as an example, and the specific operation of the pressure sensor 900 will be described later with reference to FIGS. 10 and 11.

The pressure sensor 900 may have the connection terminal 901, and the connection terminal 901 may be connected to the sensor connection portion 685 of the second substrate portion 650. The pressure sensor 900 may be electrically connected to the driver chip TIC via the sensor connection portion 685, the sensor connection line 695, and the driver chip connection portion 683.

A first bonding layer AD1 for bonding the pressure sensor 900 and the second substrate portion 650 may be located between the pressure sensor 900 and the second substrate portion 650, and a second bonding layer AD2 for bonding the pressure sensor 900 and the conductive layer 700 may be located between the pressure sensor 900 and the conductive layer 700. In an exemplary embodiment of the present invention, each of the first bonding layer AD1 and the second bonding layer AD2 may be made of a double-sided adhesive tape. In addition, each of the first bonding layer AD1 and the second bonding layer AD2 may be made of an adhesive.

In an exemplary embodiment, the pressure sensor 900 might not overlap the second sensing pattern 673. In a plan view, the pressure sensor 900 may be spaced apart from the second sensing pattern 673 and at least partially surrounded by the second sensing pattern 673.

The second FPCB 400 may be connected to the touch sensing unit 300. The second FPCB 400 may transmit signals for controlling the touch sensing unit 300 to the touch sensing unit 300. For example, the transmitted signals may be received from an external device.

The second FPCB 400 may include a third substrate portion 410, a fourth substrate portion 430, and the connection portion 451.

The third substrate portion 410 may be connected to a portion of the touch sensing unit 300 which overlaps the non-display area NDA. For example, the third substrate portion 410 may overlap the non-display area NDA. In an exemplary embodiment of the present invention, the third substrate portion 410 may be connected to a pad portion or the like of the touch sensing unit 300. In an exemplary embodiment of the present invention, the third substrate portion 410 may be located on the same side as the first substrate portion 610 of, for example, the display panel 500.

The fourth substrate portion 430 is a portion extending from the third substrate portion 410 and is not disposed on the touch sensing unit 300. The fourth substrate portion 430 may be bent toward a lower surface of the conductive layer 700. For example, the fourth substrate portion 430 may be bent around an edge of the display panel 500.

The fourth substrate portion 430 may have the connection portion 451. In an exemplary embodiment of the present invention, the connection portion 451 may be connected to the first connection portion 661 of the first FPCB 600. Accordingly, the touch sensing unit 300 may be electrically connected to the driver chip TIC mounted on the driver chip connection portion 683 via the second FPCB 400 and the first FPCB 600.

The display panel 500 will now be described in more detail with reference to FIG. 6.

Figure 6:
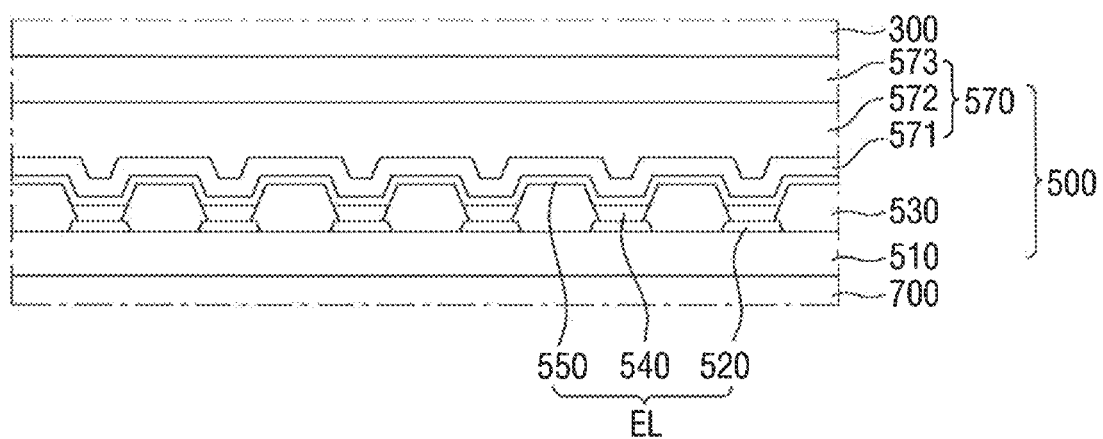
FIG. 6 is an enlarged cross-sectional view of a portion Q1 of FIG. 4 according to an exemplary embodiment of the present invention.

FIG. 6 is an enlarged cross-sectional view of a portion Q1 of FIG. 4, more specifically, an enlarged cross-sectional view of the display panel 500 of FIG. 4 according to an exemplary embodiment of the present invention.

Referring to FIG. 6, the display panel 500 includes a base substrate 510, a first electrode 520, a pixel defining layer 530, a light emitting layer 540, a second electrode 550, and an encapsulation layer 570.

The base substrate 510 may be located on the conductive layer 700. The base substrate 510 may be an insulating substrate. In an exemplary embodiment of the present invention, the base substrate 510 may include a polymer material having flexibility. Here, the polymer material may be polyethersulphone (PES), polyacrylate (PA), polyarylate (PAR), polyetherimide (PEI), polyethylenenaphthalate (PEN), polyethyleneterephthalate (PET), polyphenylenesulfide (PPS), polyallylate, polyimide (PI), polycarbonate (PC), cellulosetriacetate (CAT), cellulose acetate propionate (CAP), and/or a combination of these materials.

The first electrode 520 may be located on the base substrate 510. In an exemplary embodiment of the present invention, the first electrode 520 may be an anode.

Although not illustrated in the drawing, a plurality of elements may further be disposed between the base substrate 510 and the first electrode 520. In an exemplary embodiment of the present invention, the elements may include a buffer layer, a plurality of conductive wirings, an insulating layer, and a plurality of thin-film transistors. In an exemplary embodiment of the present invention, a stacked structure or a single-layered structure may be disposed between the base substrate 510 and the first electrode 520.

The pixel defining layer 530 may be located on the first electrode 520. For example, the pixel defining layer 530 may be disposed on a portion of the first electrode 520 and on the base substrate 510. The pixel defining layer 530 includes an opening that exposes at least a portion of the first electrode 520.

The light emitting layer 540 may be located on the first electrode 520. For example, the light emitting layer 540 may be disposed on the exposed portion of the first electrode 520.

In an exemplary embodiment of the present invention, the light emitting layer 540 may emit one of red light, green light, or blue light. The wavelength of the red light may be about 620 nm to about 750 nm, and the wavelength of the green light may be about 495 nm to about 570 nm. In addition, the wavelength of the blue light may be about 450 nm to about 495 nm.

In an exemplary embodiment of the present invention, the light emitting layer 540 may emit white light. When emitting white light, the light emitting layer 540 may have a stacked structure of a red light emitting layer, a green light emitting layer, and a blue light emitting layer. In addition, the light emitting layer 540 may further include color filters for displaying red, green, and blue.

In an exemplary embodiment of the present invention, the light emitting layer 540 may be an organic light emitting layer. In an exemplary embodiment of the present invention, the light emitting layer 540 may also be a quantum dot light emitting layer or an inorganic light emitting layer.

The second electrode 550 may be disposed on the light emitting layer 540 and the pixel defining layer 530. For example, the second electrode 550 may be formed on the entire surface of the light emitting layer 540 and the pixel defining layer 530 in an exemplary embodiment of the present invention. In an exemplary embodiment of the present invention, the second electrode 550 may be a cathode.

The first electrode 520, the second electrode 550, and the light emitting layer 540 may constitute each of a plurality of self-luminous elements EL.

The encapsulation layer 570 may be located on the self-luminous elements EL. The encapsulation layer 570 may seal the self-luminous elements EL and may prevent moisture or the like from entering the self-luminous elements EL from the outside.

In an exemplary embodiment of the present invention, the encapsulation layer 570 may be formed by thin-film encapsulation and may include one or more organic layers and/or one or more inorganic layers. For example, the encapsulation layer 570 may include a first inorganic layer 571 located on the second electrode 550, an organic layer 572 located on the first inorganic layer 571, and a second inorganic layer 573 located on the organic layer 572. However, the present invention is not limited to the number of organic and inorganic layers in the encapsulation layer 570.

The first inorganic layer 571 may be disposed on the self-luminous elements EL and may prevent the introduction of moisture, oxygen, and the like into the self-luminous elements EL. In an exemplary embodiment of the present invention, the first inorganic layer 571 includes an inorganic material. The inorganic material may include any one or more of silicon oxide (SiOx), silicon nitride (SiNx), and/or silicon oxynitride (SiONx).

The organic layer 572 may be disposed on the first inorganic layer 571. The organic layer 572 may provide a substantially flat surface. The organic layer 572 includes an organic material, and the organic material may include any one of epoxy, acrylate, and/or urethane acrylate.

The second inorganic layer 573 may be disposed on the organic layer 572. The second inorganic layer 573 may prevent the introduction of moisture, oxygen, and the like into the self-luminous elements EL and may be made of substantially the same or similar material as the first inorganic layer 571. The second inorganic layer 573 may cover the organic layer 572. For example, the second inorganic layer 573 may completely overlap the organic layer 572. In an exemplary embodiment of the present invention, the second inorganic layer 573 and the first inorganic layer 571 may contact each other in the non-display area NDA to form an inorganic-inorganic junction. The inorganic-inorganic junction can prevent moisture and the like from entering the display device 1 from outside the display device 1.

In FIG. 6, each of the first inorganic layer 571, the organic layer 572, and the second inorganic layer 573 is illustrated as a single layer. However, the present invention is not limited to this case. For example, at least one of the first inorganic layer 571, the organic layer 572, and the second inorganic layer 573 may have a multilayer structure.

The touch sensing unit 300 may be disposed on the encapsulation layer 570.

The touch sensing unit 300 will now be described in more detail with reference to FIGS. 7 through 9.

Figure 7:
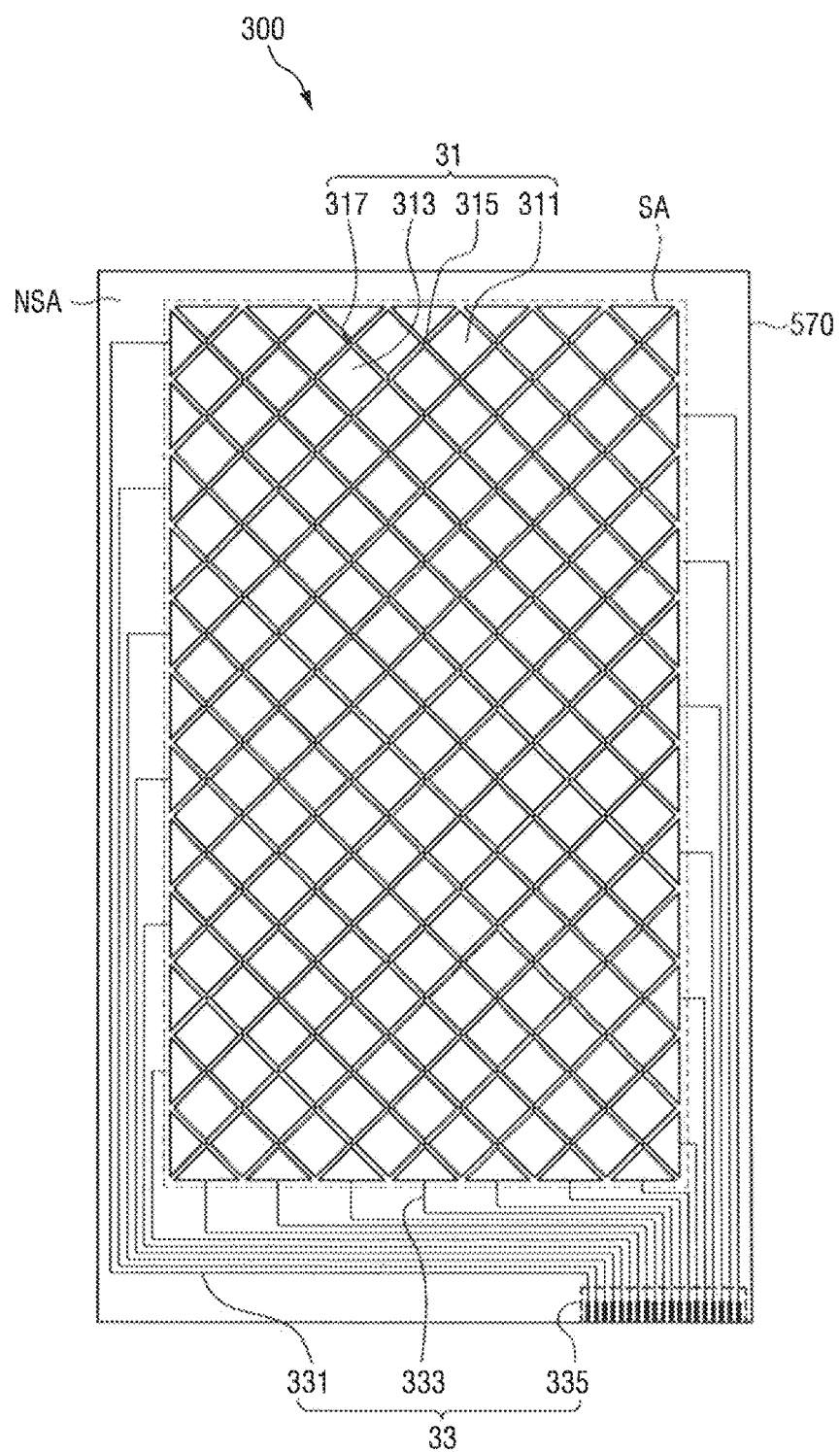
FIG. 7 is a plan view of a touch sensing unit of a display device according to an exemplary embodiment of the present invention.

FIG. 7 is a plan view of the touch sensing unit 300 of the display device 1 according to an exemplary embodiment of the present invention. FIG. 8 is a partial enlarged view of the touch sensing unit 300 illustrated in FIG. 7 according to an exemplary embodiment of the present invention. FIG. 9 is a cross-sectional view of the touch sensing unit 300, taken along line D-D' of FIG. 8 according to an exemplary embodiment of the present invention.

Referring to FIG. 7, the touch sensing unit 300 is disposed on the encapsulation layer 570. In a plan view, the touch sensing unit 300 may include a sensing area SA capable of sensing a touch and a non-sensing area NSA outside the sensing area SA that might not sense a touch. The sensing area SA may be an area overlapping the display area DA of the display panel 500, and a first part 31 of the touch sensing unit 300 may be located in the sensing area SA. The non-sensing area NSA may be an area that does not sense a touch and overlaps the non-display area NDA of the display panel 500. A second part 33 of the touch sensing unit 300 may be located in the non-sensing area NSA.

The first part 31 of the touch sensing unit 300 includes a plurality of touch electrodes, and the touch electrodes include a plurality of first touch electrodes 311 and a plurality of second touch electrodes 313. The first touch electrodes 311 and the second touch electrodes 313 are separated from each other.

The first touch electrodes 311 and the second touch electrodes 313 may be alternately arranged in the sensing area SA so as not to substantially overlap each other. The first touch electrodes 311 and the second touch electrodes 313 may be alternately arranged along a column direction and a row direction.

The first touch electrodes 311 and the second touch electrodes 313 may be located on the same layer or on different layers. Each of the first touch electrodes 311 and the second touch electrodes 313 may have a quadrilateral or rhombus shape. However, each of the first and second touch electrodes 311 and 313 is not limited to the above shapes and can have various shapes; for example, the first and second touch electrodes 311 and 313 can have a protrusion for increasing the sensitivity of the touch sensing unit 300.

The first touch electrodes 311 located in each row may be connected to each other by a first connection portion 315, and the second touch electrodes 313 located in each column may be connected to each other by a second connection portion 317. For example, the first touch electrodes 311 may be connected to each other in a row direction through the first connection portion 315, and the second touch electrodes 313 may be connected to each other in a column direction, intersecting the row direction, through the second connection portion 317.

Figure 8:
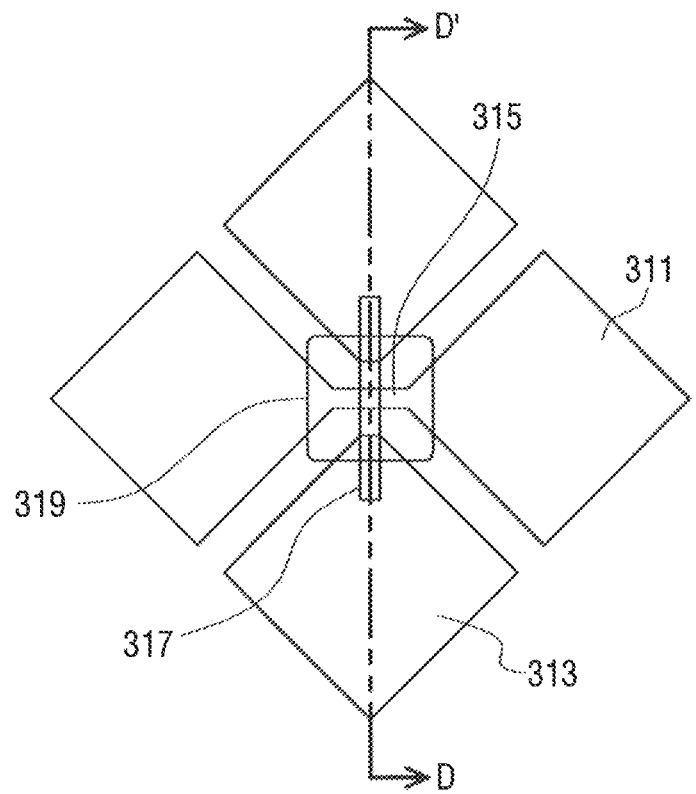
FIG. 8 is a partial enlarged view of a touch sensing unit illustrated in FIG. 8 according to an exemplary embodiment of the present invention.
Figure 9:
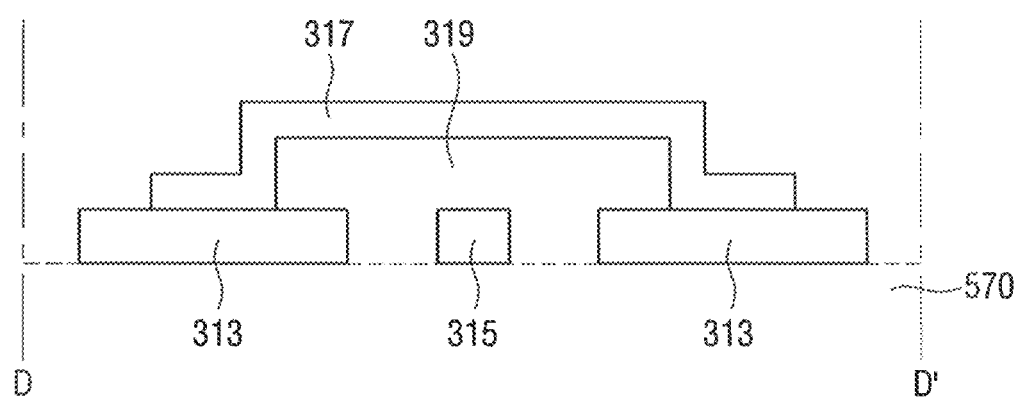
FIG. 9 is a cross-sectional view of a touch sensing unit, taken along line D-D' of FIG. 8 according to an exemplary embodiment of the present invention.

Referring further to FIGS. 8 and 9, the first connection portion 315 connecting neighboring first touch electrodes 311 may be disposed on the same layer as the first touch electrodes 311 and may be made of the same material as the first touch electrodes 311. For example, the first touch electrodes 311 and the first connection portion 315 may be integrated with each other and may be simultaneously patterned.

The second connection portion 317 connecting neighboring second touch electrodes 313 may be located on a different layer from the second touch electrodes 313. For example, the second touch electrodes 313 and the second connection portion 317 may be separately patterned. For example, the second touch electrodes 313 may be separated from the second connection portion 317, and the second touch electrodes 313 may be indirectly connected to the second connection portion 317. The second touch electrodes 313 and the second connection portion 317 are connected to each other by being in direct contact with each other.

An insulating layer 319 is located between the first connection portion 315 and the second connection portion 317 to insulate the first connection portion 315 and the second connection portion 317 from each other. As illustrated in FIGS. 8 and 9, the insulating layer 319 may include an insulating material and have a rectangular shape. The insulating layer 319 may be disposed at each intersection of the first connection portion 315 and the second connection portion 317. The insulating layer 319 may be separated from other insulating layers 319. In an exemplary embodiment of the present invention, the insulating layer 319 may be formed over the entire surface of the first touch electrode 311 and the second touch electrode 313, and the insulating layer 319 which is located on a portion of each of the second touch electrodes 313 neighboring each other in the column direction may be removed so that the second connection 317 may connect the second touch electrodes 313.

Referring again to FIG. 7, the second part 33 of the touch sensing unit 300 may include a first touch signal line 331 and a second touch signal line 333.

The first touch electrodes 311 connected to each other in each row may be electrically connected to the driver chip TIC by the first touch signal line 331, and the second touch electrodes 313 connected to each other in each column may be electrically connected to the driver chip TIC by the second touch signal line 333. In an exemplary embodiment of the present invention, ends of the first touch signal line 331 and the second touch signal line 333 may form a pad portion 335 on the encapsulation layer 570 or the display panel 500. The pad portion 335 may be connected to the first substrate portion 610 of the first FPCB 600.

A first touch electrode 311 and a second touch electrode 313 neighboring each other may form a capacitance, and any one of the first touch electrode 311 and the second touch electrode 313 may output a change in mutual capacitance caused by an external object or a touch input as a sensing signal.

The pressure sensor 900 will now be described in more detail with reference to FIGS. 10 and 11.

Figure 10:
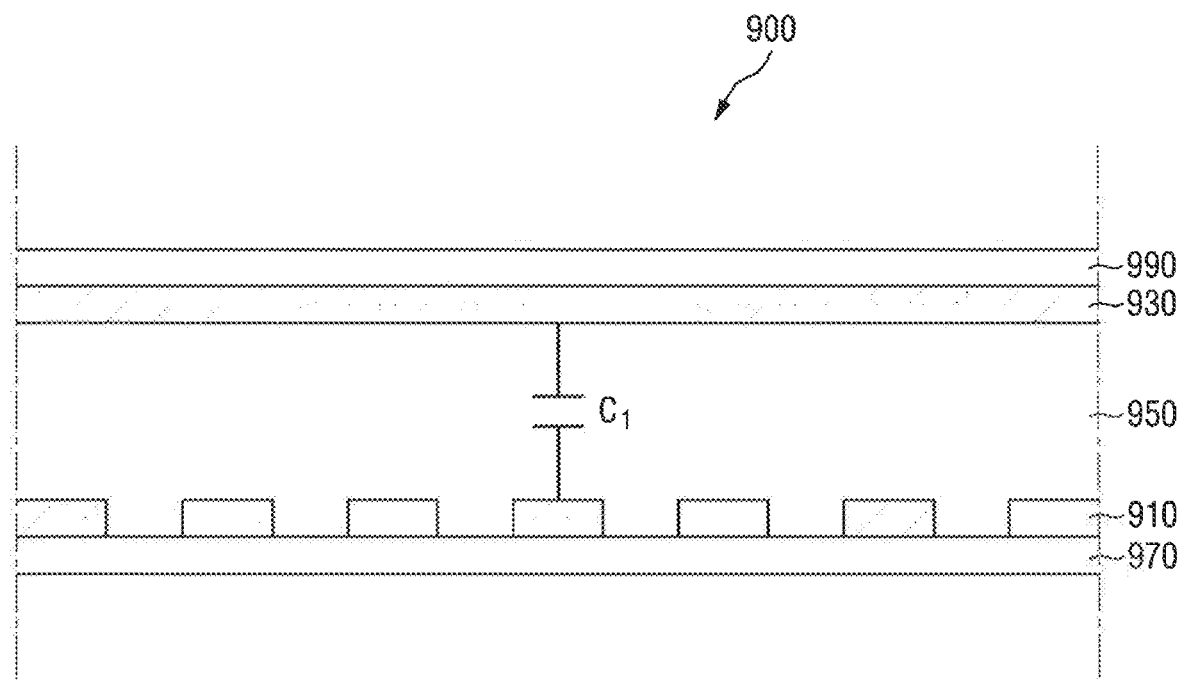
FIG. 10 is a cross-sectional view of a pressure sensor of the display device according to an exemplary embodiment of the present invention.
Figure 11:
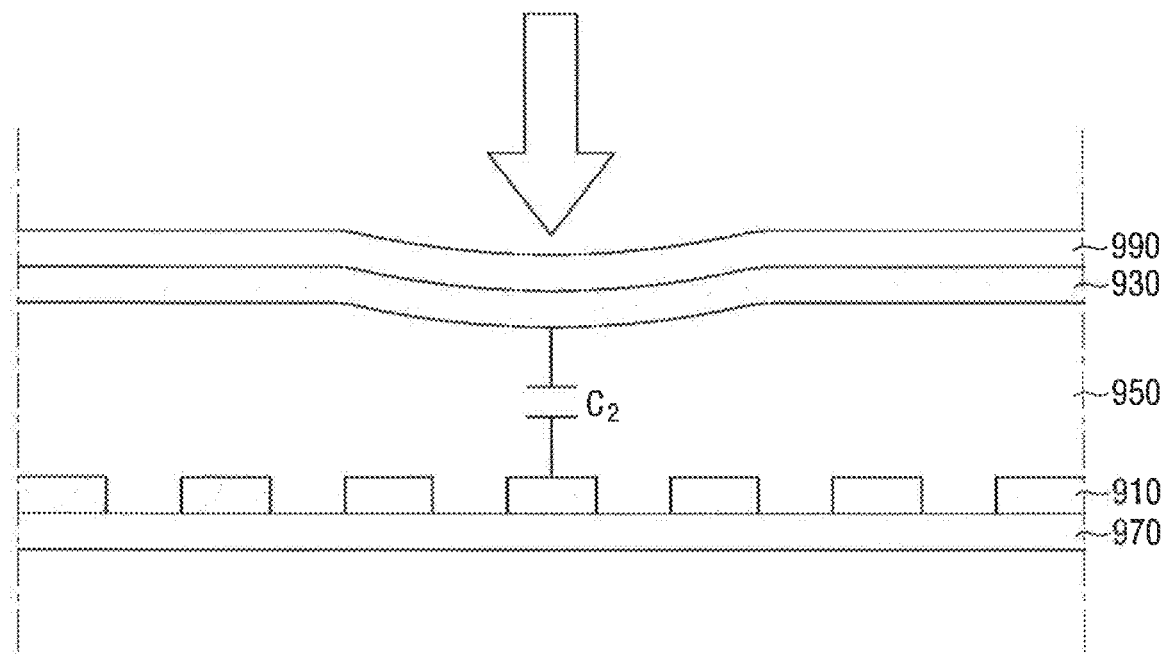
FIG. 11 is a view for explaining the operation of the pressure sensor of FIG. 10 according to an exemplary embodiment of the present invention.

FIG. 10 is a cross-sectional view of the pressure sensor 900 of the display device 1 according to an exemplary embodiment of the present invention. FIG. 11 is a view for explaining the operation of the pressure sensor 900 of FIG. 10 according to an exemplary embodiment of the present invention. Referring to FIGS. 10 and 11, the pressure sensor 900 may include first electrodes 910 and a second electrode 930 facing each other and an elastic layer 950 interposed between the first electrodes 910 and the second electrode 930.

The first electrodes 910 and the second electrode 930 may face each other and may be spaced apart from each other. The first electrodes 910 and the second electrode 930 may overlap each other. In an exemplary embodiment of the present invention, the first electrodes 910 and the second electrode 930 might not overlap each other and extend in the same direction. In an exemplary embodiment of the present invention, a reference voltage may be provided to at least one of the first and second electrodes 910 and 930, and a driving voltage may be provided to the other electrode of the first and second electrodes 910 and 930. In an exemplary embodiment of the present invention, the reference voltage may be a ground voltage.

The elastic layer 950 is located between the first electrodes 910 and the second electrode 930. The elastic layer 950 may have elasticity. For example, the elastic layer 950 may be compressed when pressure is applied and return to its original shape when the applied pressure is removed. For example, when a touch input occurs, the elastic layer 950 may be compressed, thereby reducing the distance between the first electrodes 910 and the second electrode 930. In addition, when the touch input is released, the elastic layer 950 may return to its original shape.

The first electrodes 910, the second electrode 930, and the elastic layer 950 may form a capacitor with a capacitance. For example, when a touch input is not applied, a first capacitance $C_1$ may be formed between the first electrodes 910 and the second electrode 930. On the other hand, when a touch input is applied, the elastic layer 950 may be compressed. Accordingly, the distance between the first electrodes 910 and the second electrode 930 may be reduced compared with when the touch input is not applied. If all conditions are the same, the capacitance between the first electrodes 910 and the second electrode 930 is inversely proportional to the distance between the first electrodes 910 and the second electrode 930. Therefore, a second capacitance $C_2$ greater than the first capacitance $C_1$ may be formed between the first electrodes 910 and the second electrode 930. The driver chip TIC may obtain the position of a touch input and the intensity of the touch input based on the capacitance generated in the pressure sensor 900. For example, the driver chip TIC may detect the intensity of a touch input by comparing a predetermined reference value with the magnitude of capacitance obtained from the pressure sensor 900. For example, in a case where the reference value is substantially equal to the first capacitance $C_1$, the first capacitance $C_1$ obtained by the driver chip TIC when no touch input occurs is substantially equal to the reference value. Therefore, the driver chip TIC may determine that no touch has occurred. When a touch input occurs, the second chip capacitance $C_2$ obtained by the driver chip TIC is greater than the reference value. Therefore, the driver chip TIC may determine that a touch has occurred and may detect the intensity of the touch based on the difference between the reference value and the second capacitance $C_2$.

In an exemplary embodiment of the present invention, the pressure sensor 900 may further include a first support member 970 and a second support member 990 which support the first electrodes 910, the second electrode 930 and the elastic layer 950. In an exemplary embodiment of the present invention, the first support member 970 may be disposed on the first electrode 910, and the second support member 990 may be disposed on the second electrode 930.

The lift detection operation of the display device 1 will now be described.

Figure 12:
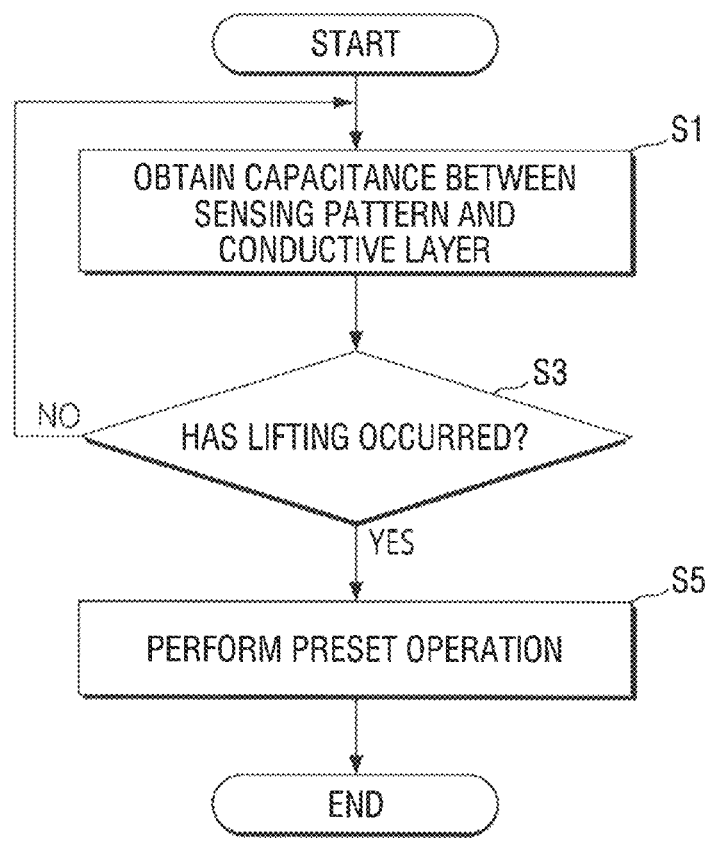
FIG. 12 is a flowchart illustrating the operation of a display device according to an exemplary embodiment of the present invention.
Figure 13:
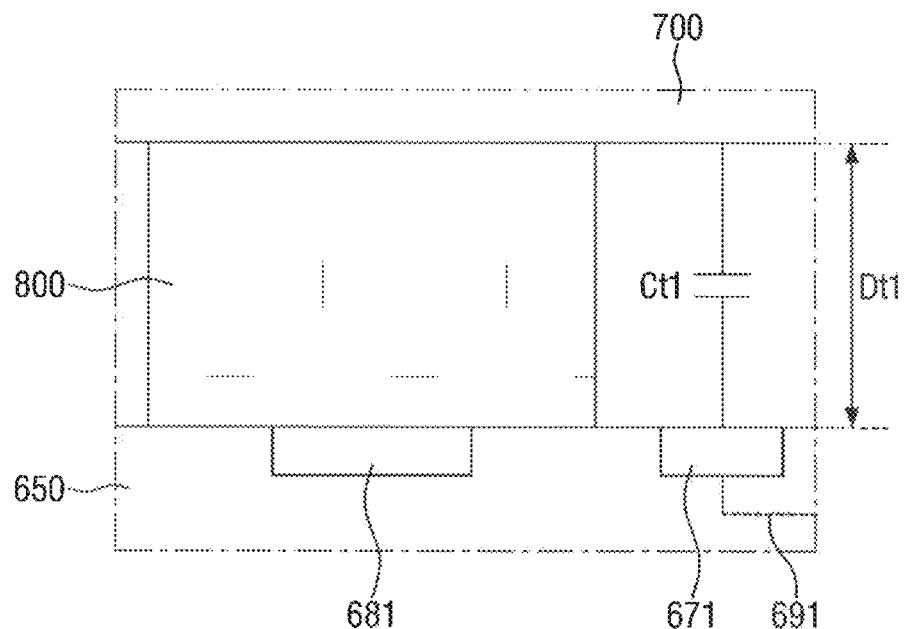
FIGS. 13, 14 and 15 are enlarged cross-sectional views of a portion Q2 of FIG. 4, illustrating a lift detection operation using a first sensing pattern according to an exemplary embodiment of the present invention.
Figure 14:
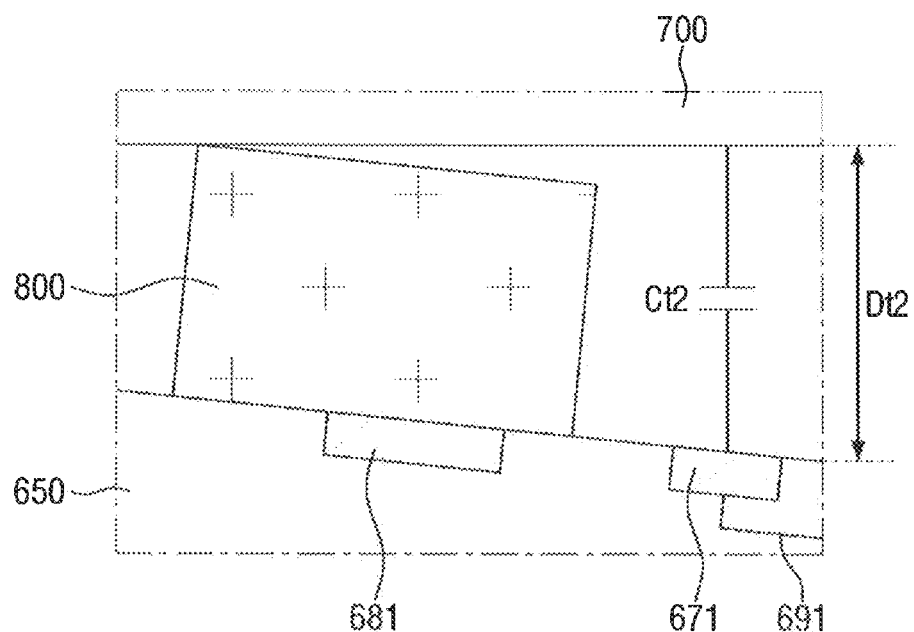
Figure 15:
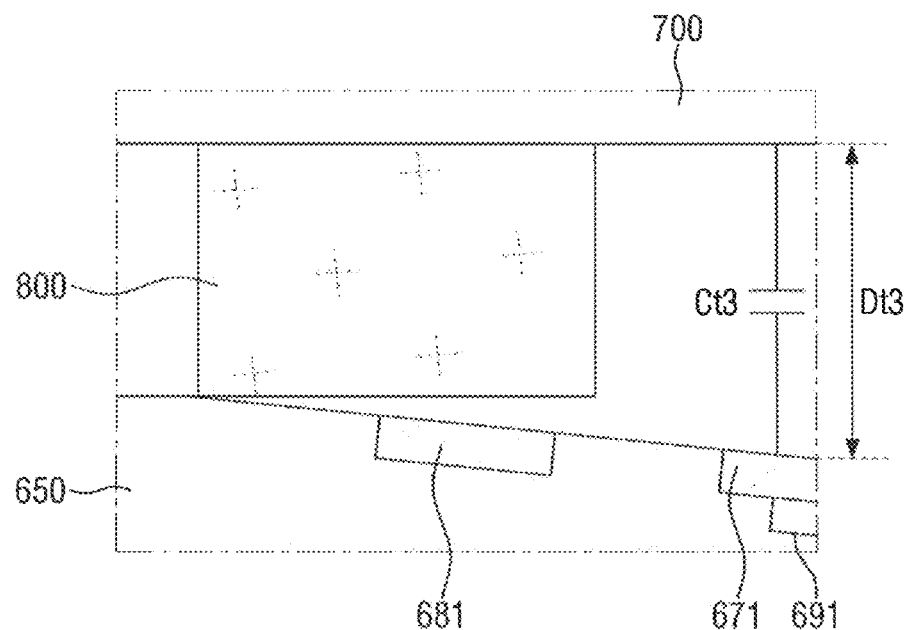
Figure 16:
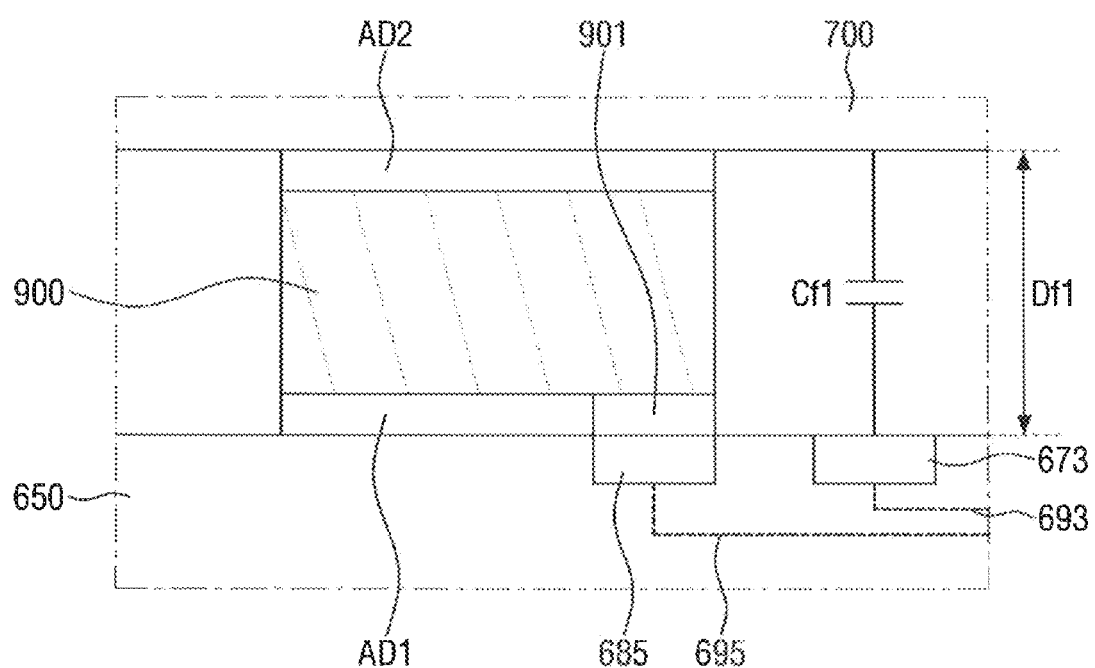
FIGS. 16, 17 and 18 are enlarged cross-sectional views of a portion Q3 of FIG. 5, illustrating a lift detection operation using a second sensing pattern according to an exemplary embodiment of the present invention.
Figure 17:
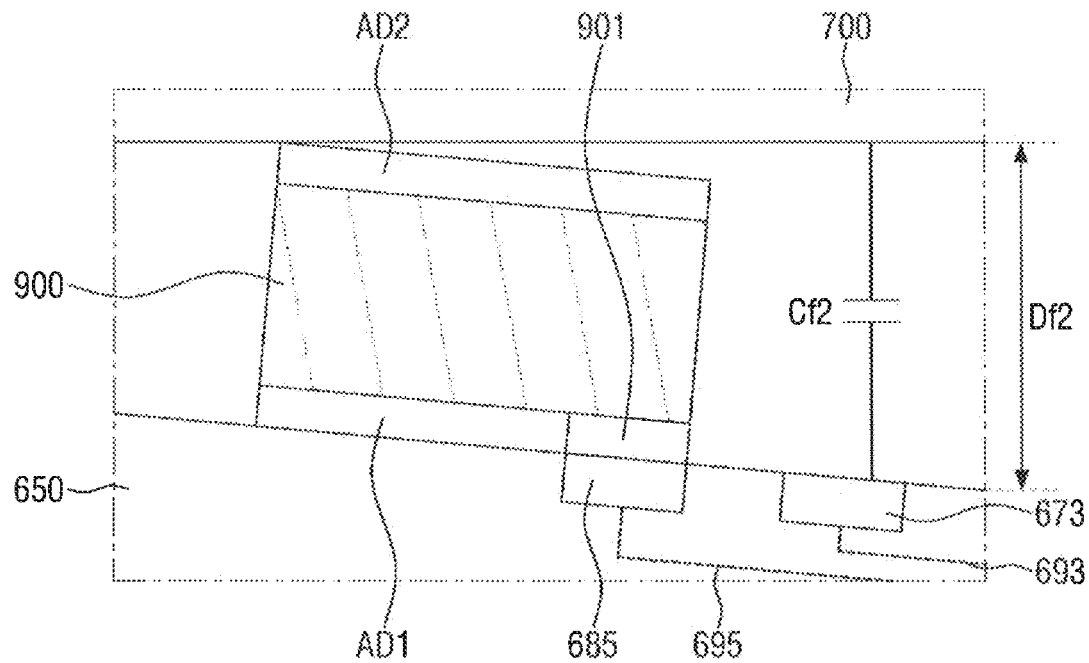
Figure 18:
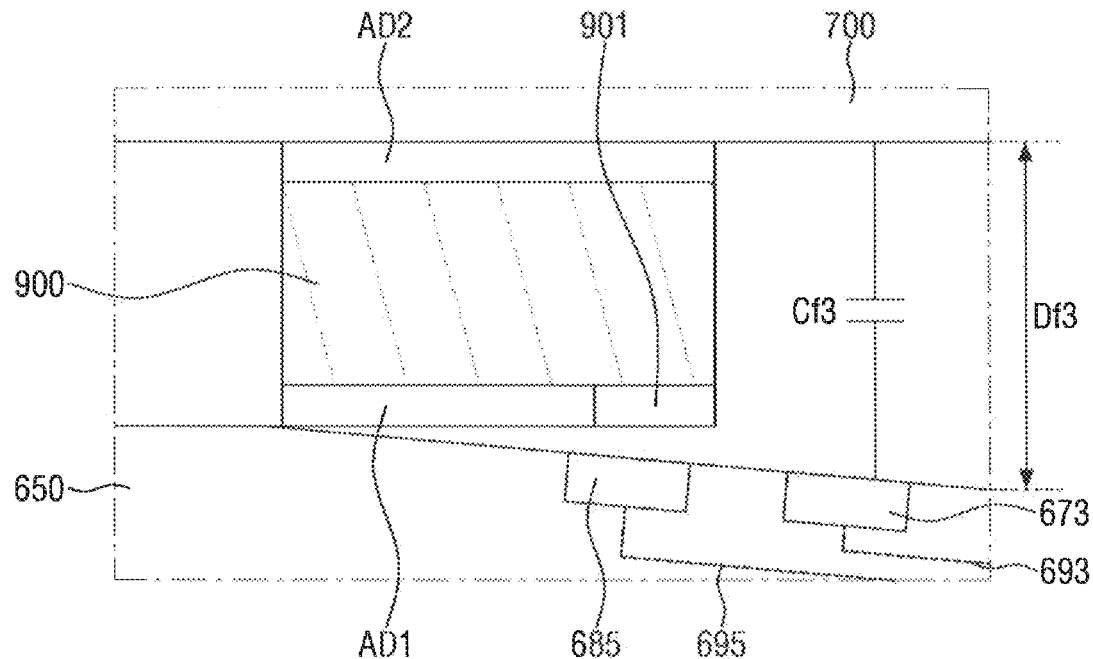

FIG. 12 is a flowchart illustrating the operation of the display device 1 according to an exemplary embodiment of the present invention. FIGS. 13 through 15 are enlarged cross-sectional views of a portion Q2 of FIG. 4, illustrating a lift detection operation using the first sensing pattern 671 according to an exemplary embodiment of the present invention. FIGS. 16 through 18 are enlarged cross-sectional views of a portion Q3 of FIG. 5, illustrating a lift detection operation using the second sensing pattern 673 according to an exemplary embodiment of the present invention.

Referring to FIG. 12, the display device 1 may obtain a capacitance between a sensing pattern and a conductive layer (operation S1) and determine whether lifting has occurred based on the obtained capacitance (operation S3). When it is determined that lifting has occurred, a predetermined operation may be further performed (operation S5). When it is determined that lifting has not occurred, the operation of the display device 1 may restart.

Referring further to FIGS. 13 through 15, an inspection signal (a voltage or the like) is provided from the driver chip TIC to the first sensing pattern 671 via the first connection line 691. Therefore, a capacitance may be formed between the first sensing pattern 671 and the conductive layer 700. If other conditions are substantially the same, the magnitude of the capacitance between the first sensing pattern 671 and the conductive layer 700 is inversely proportional to the distance between the first sensing pattern 671 and the conductive layer 700. The magnitude of the capacitance changes as the distance changes.

Therefore, as illustrated in FIG. 13, when the first sensing pattern 671 and the conductive layer 700 are spaced apart from each other by a first distance Dt1 since the coupling portion 800 has not been lifted, a first capacitance Ct1 is formed between the first sensing pattern 671 and the conductive layer 700.

In addition, when a part of the coupling portion 800 is separated from the conductive layer 700 as illustrated in FIG. 14, the distance between the first sensing pattern 671 and the conductive layer 700 may increase from the first distance Dt1 to a second distance Dt2. Accordingly, a second capacitance Ct2 which is smaller in magnitude than the first capacitance Ct1 may be formed between the first sensing pattern 671 and the conductive layer 700.

In addition, when a part of the coupling portion 800 is separated from the second substrate portion 650 as illustrated in FIG. 15, the distance between the first sensing pattern 671 and the conductive layer 700 may increase from the first distance Dt1 to a third distance Dt3. Accordingly, a third capacitance Ct3 which is smaller in magnitude than the first capacitance Ct1 may be formed between the first sensing pattern 671 and the conductive layer 700.

Since the first sensing pattern 671 is electrically connected to the driver chip TIC as described above, the driver chip TIC may obtain a capacitance between the first sensing pattern 671 and the conductive layer 700 from the first sensing pattern 671 and detect the lifting of the coupling portion 800 from either, for example, the conductive layer 700 or the second substrate portion 650 based on the obtained capacitance. For example, the driver chip TIC may store a reference value for determining whether the coupling portion 800 has been lifted, compare the stored reference value with the magnitude of the obtained capacitance between the first sensing pattern 671 and the conductive layer 700, and determine that the coupling portion 800 has been lifted when the difference between the reference value and the obtained capacitance between the first sensing pattern 671 and the conductive layer 700 exceeds a predetermined range. For example, operations S and S3 described above in FIG. 12 may be performed by the driver chip TIC.

When the coupling portion 800 is lifted, a ground voltage applied to the ground portion 681 may not be transmitted to the conductive layer 700. Accordingly, noise may be generated due to the interference between the conductive layer 700 and the driver chip TIC. The noise can cause a reduction in touch sensitivity.

According to an exemplary embodiment of the present invention, since the lifting of the coupling portion 800 can be detected using the first sensing pattern 671 and the conductive layer 700, it is possible to reduce a defect rate in the process of manufacturing the display device 1. In addition, maintenance of the display device 1 may be more cost efficient.

Referring further to FIGS. 16 through 18, an inspection signal (a voltage or the like) is provided from the driver chip TIC to the second sensing pattern 673 via the second connection line 693. Therefore, a capacitance may be formed between the second sensing pattern 673 and the conductive layer 700. The magnitude of the capacitance is inversely proportional to the distance between the second sensing pattern 673 and the conductive layer 700. The magnitude of the capacitance changes as the distance changes.

Therefore, as illustrated in FIG. 16, when the second sensing pattern 673 and the conductive layer 700 are spaced apart from each other by a first distance Df1 since the pressure sensor 900 has not been lifted from, for example, the second substrate portion 650, a first capacitance Cf1 is formed between the second sensing pattern 673 and the conductive layer 700.

In addition, when the pressure sensor 900 is lifted because, for example, the second bonding layer AD2 is separated from the conductive layer 700 as illustrated in FIG. 17, the distance between the second sensing pattern 673 and the conductive layer 700 may increase from the first distance Df1 to a second distance Df2. Accordingly, a second capacitance Cf2 which is smaller in magnitude than the first capacitance Cf1 may be formed between the second sensing pattern 673 and the conductive layer 700.

In addition, when the pressure sensor 900 is lifted because, for example, the first bonding layer AD1 is separated from the second substrate portion 650 as illustrated in FIG. 18, the distance between the second sensing pattern 673 and the conductive layer 700 may increase from the first distance Df1 to a third distance Df3. Accordingly, a third capacitance Cf3 which is smaller in magnitude than the first capacitance Cf1 may be formed between the second sensing pattern 673 and the conductive layer 700.

Since the second sensing pattern 673 is electrically connected to the driver chip TIC as described above, the driver chip TIC may obtain a capacitance between the second sensing pattern 673 and the conductive layer 700 from the second sensing pattern 673 and detect the lifting of the pressure sensor 900 based on the obtained capacitance. For example, the driver chip TIC may store a reference value, compare the capacitance between the second sensing pattern 673 and the conductive layer 700 with the reference value, and determine whether the pressure sensor 900 has been lifted based on the comparison result.

In an exemplary embodiment of the present invention, the reference value stored in the driver chip TIC and used to determine whether the coupling portion 800 has been lifted may be different from the reference value stored in the driver chip TIC and used to determine whether the pressure sensor 900 has been lifted. In an exemplary embodiment of the present invention, the reference value for determining whether the coupling portion 800 may be substantially similar to the reference value for determining whether the pressure sensor 900 has been lifted. When detecting/determining that at least one of the coupling portion 800 and the pressure sensor 900 has been lifted, the driver chip TIC may transmit a result signal to the main circuit board MP. In response to the result signal received from the driver chip TIC, the main circuit board MP may control the display device 1 to perform a predetermined operation. For example, operation S5 of FIG. 12 may be performed by the main circuit board MP.

In an example, the predetermined operation may be a warning message displayed on the display device 1 or a power-off operation. For example, when receiving from the driver chip TIC a result signal indicating that lifting has occurred, the main circuit board MP may control the display panel 500 or the panel driver chip PIC to display a warning message on the display panel 500. In addition, when receiving from the driver chip TIC a result signal indicating that lifting has occurred, the main circuit board MP may terminate the power supplied to the display panel 500 or may turn off the display device 1. However, this is only an example, and the predetermined operation may be various operations. For example, the predetermined operation could be the display panel 500 flashing on and off.

According to an exemplary embodiment of the present invention described above, whether the coupling portion 800 has been lifted can be detected using the first sensing pattern 671, and whether the pressure sensor 900 has been lifted can be detected using the second sensing pattern 673. Therefore, it is possible to reduce a defect rate in the process of manufacturing the display device 1. In addition, it may be useful in terms of maintenance of the display device 1.

Figure 19:
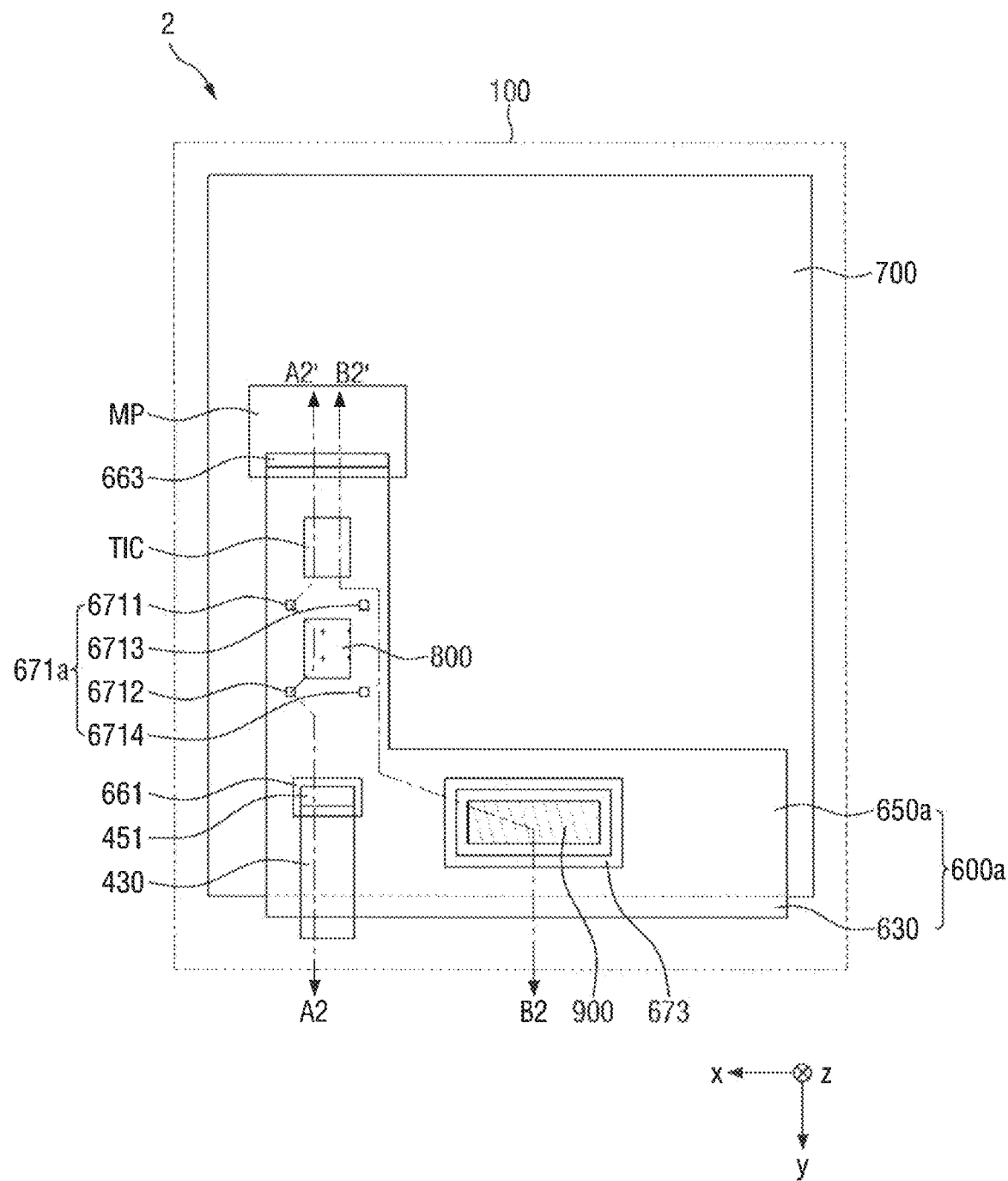
FIG. 19 is a rear view of a display device according to an exemplary embodiment of the present invention.
Figure 20:
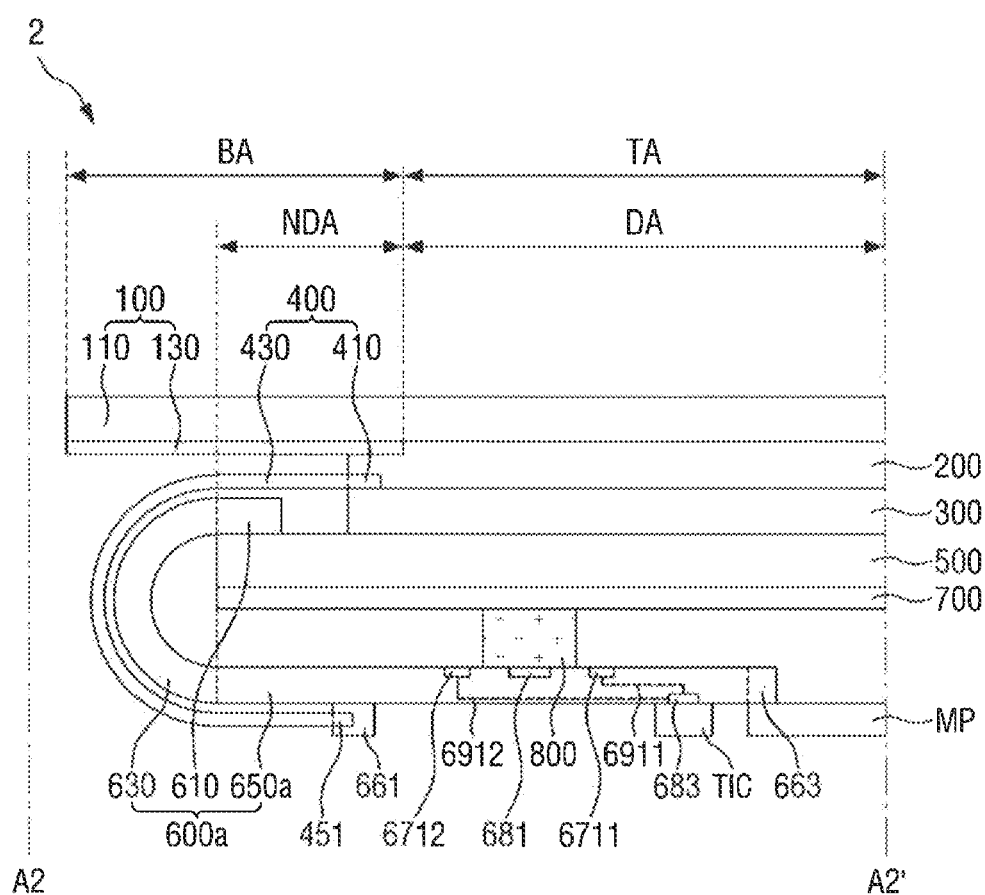
FIG. 20 is a cross-sectional view taken along line A2-A2' of FIG. 19 according to an exemplary embodiment of the present invention.
Figure 21:
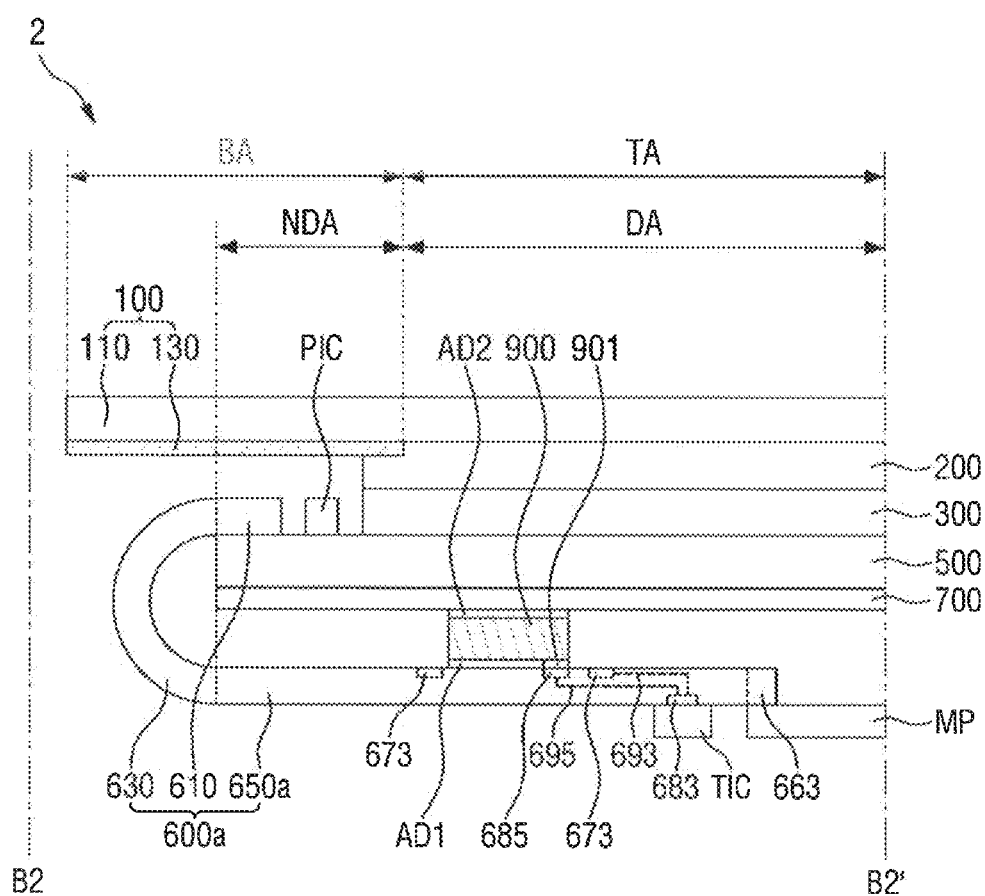
FIG. 21 is a cross-sectional view taken along line B-B' of FIG. 19 according to an exemplary embodiment of the present invention.

FIG. 19 is a rear view of a display device 2 according to an exemplary embodiment of the present invention. FIG. 20 is a cross-sectional view taken along line A2-A2' of FIG. 19 according to an exemplary embodiment of the present invention. FIG. 21 is a cross-sectional view taken along line B-B' of FIG. 19 according to an exemplary embodiment of the present invention.

Referring to FIGS. 19 through 21, the display device 2 according to an exemplary embodiment of the present invention is substantially the same as the display device 1 described above with reference to FIGS. 1 through 18, except that it includes a first FPCB 600*a*. In addition, the first FPCB 600*a* is substantially the same or similar to the first FPCB 600 of the display device 1, except that a second substrate portion 650*a* includes a first sensing pattern 671*a*. Therefore, any redundant description will be omitted, and the following description will focus mainly on differences.

The first sensing pattern 671*a* of the second substrate portion 650*a* may include a plurality of sub-sensing patterns (6711 through 6714) spaced apart from each other and located adjacent to a coupling portion 800. For example, the first sensing pattern 671*a* may include a first sub-sensing pattern 6711, a second sub-sensing pattern 6712, a third sub-sensing pattern 6713, and a fourth sub-sensing pattern 6714.

In an exemplary embodiment, the first sub-sensing pattern 6711, the second sub-sensing pattern 6712, the third sub-sensing pattern 6713, and the fourth sub-sensing pattern 6714 may each correspond to a corner of the coupling portion 800.

The first sub-sensing pattern 6711, the second sub-sensing pattern 6712, the third sub-sensing pattern 6713 and the fourth sub-sensing pattern 6714 may each be electrically connected to a driver chip TIC by separate lines. For example, the first sub-sensing pattern 6711 may be connected to a driver chip connection portion 683 by a first sub-connection line 6911, and the second sub-sensing pattern 6712 may be connected to the driver chip connection portion 683 by a second sub-connection line 6912 separated from the first sub-connection line 6911. The third sub-sensing pattern 6713 and the fourth sub-sensing pattern 6714 may each be connected to the driver chip connection portion 683 by separate sub-connection lines. The driver chip TIC may independently obtain a capacitance from each of the first sub-sensing pattern 6711, the second sub-sensing pattern 6712, the third sub-sensing pattern 6713 and the fourth sub-sensing pattern 6714 and may determine which part of the coupling portion 800 has been lifted or peeled based on the obtained capacitance.

However, the present invention is not limited to the above description, and the number of sub-sensing patterns included in the first sensing pattern 671*a* and the arrangement of the sub-sensing patterns may be variously changed.

Figure 22:
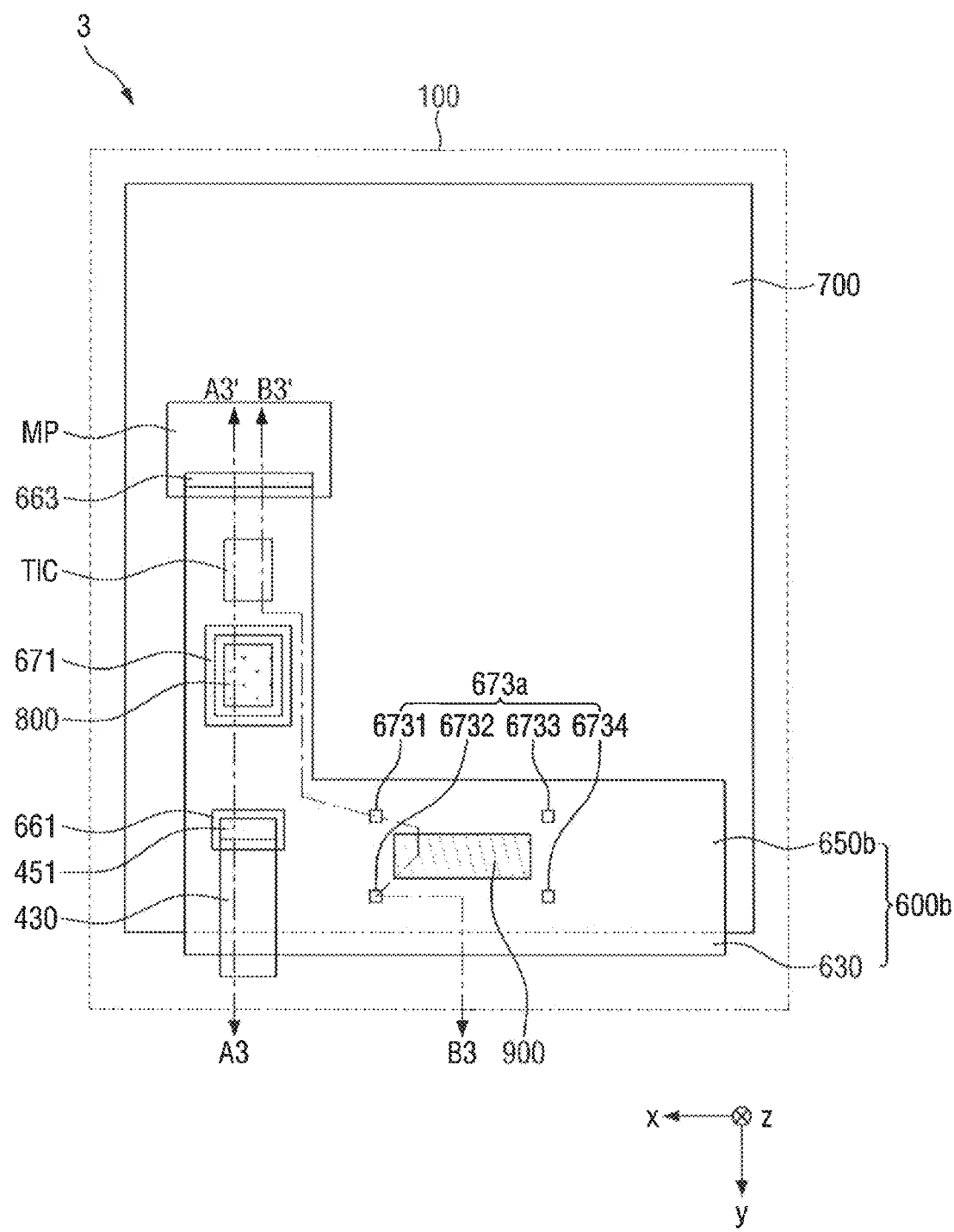
FIG. 22 is a rear view of a display device according to an exemplary embodiment of the present invention.
Figure 23:
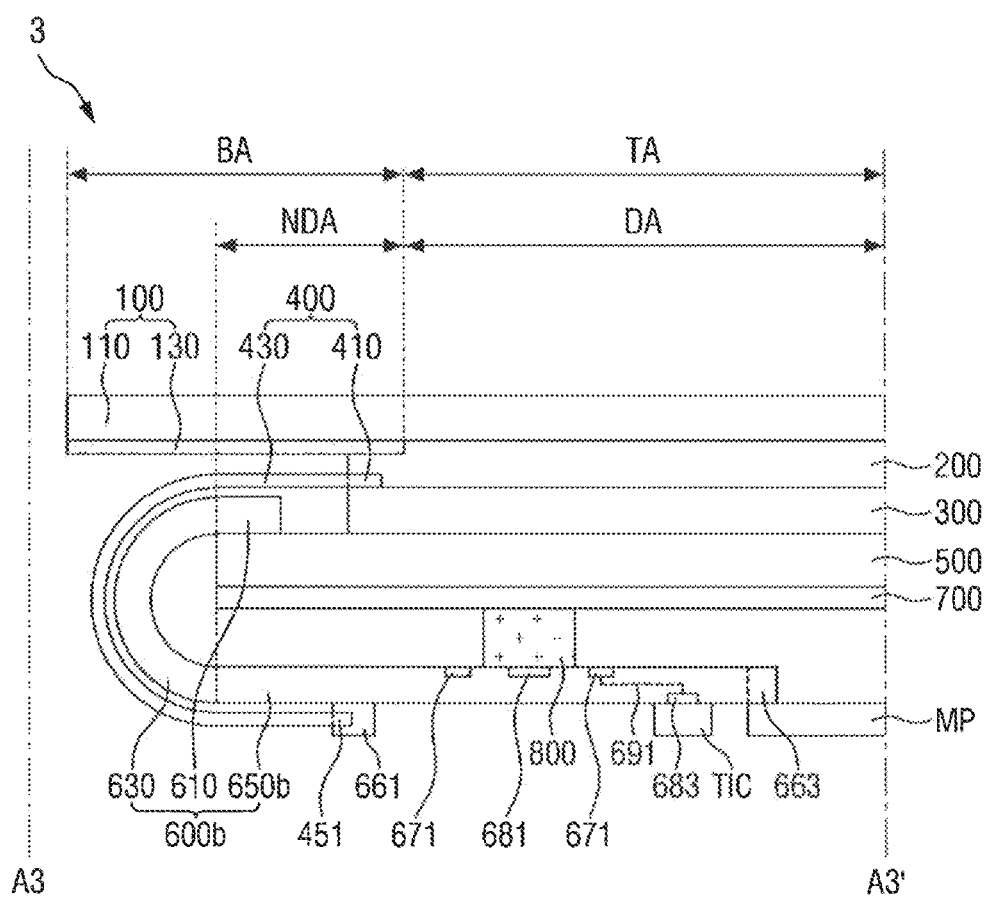
FIG. 23 is a cross-sectional view taken along line A3-A3' of FIG. 22 according to an exemplary embodiment of the present invention.
Figure 24:
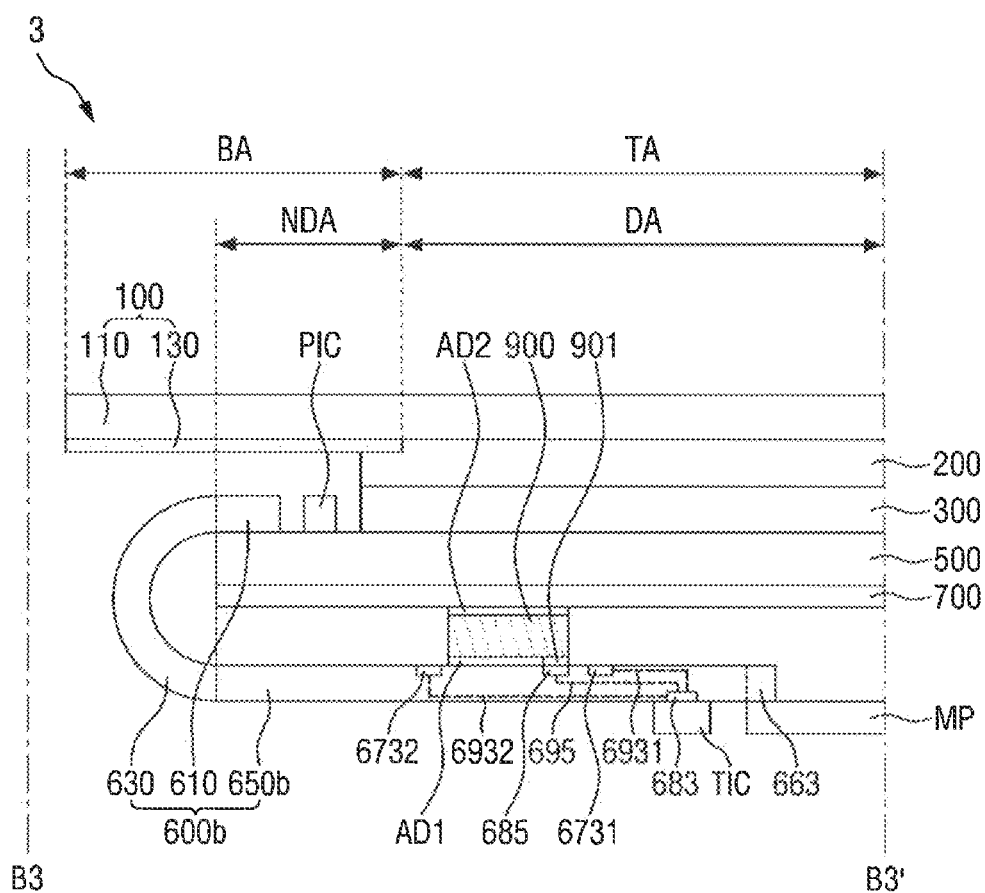
FIG. 24 is a cross-sectional view taken along line B3-B3' of FIG. 23 according to an exemplary embodiment of the present invention.

FIG. 22 is a rear view of a display device 3 according to an exemplary embodiment of the present invention. FIG. 23 is a cross-sectional view taken along line A3-A3' of FIG. 22 according to an exemplary embodiment of the present invention. FIG. 24 is a cross-sectional view taken along line B3-B3' of FIG. 23 according to an exemplary embodiment of the present invention.

Referring to FIGS. 22 through 24, the display device 3 according to an exemplary embodiment of the present invention is substantially the same as the display device 1 described above with reference to FIGS. 1 through 18, except that it includes a first FPCB 600*b*. In addition, the first FPCB 600*b* is substantially the same or similar to the first FPCB 600 of the display device 1, except that a second substrate portion 650*b* includes a second sensing pattern 673*a*. Therefore, any redundant description may be omitted, and the following description may focus mainly on differences.

The second sensing pattern 673*a* of the second substrate portion 650*b* may include a plurality of sub-sensing patterns (6731, 6732, 6733 and 6734) spaced apart from each other and located adjacent to a pressure sensor 900. For example, the second sensing pattern 673*a* may include a fifth sub-sensing pattern 6731, a sixth sub-sensing pattern 6732, a seventh sub-sensing pattern 6733, and an eighth sub-sensing pattern 6734.

In an exemplary embodiment of the present invention, the fifth sub-sensing pattern 6731, the sixth sub-sensing pattern 6732, the seventh sub-sensing pattern 6733, and the eighth sub-sensing pattern 6734 may each correspond to a corner of the pressure sensor 900

The fifth sub-sensing pattern 6731, the sixth sub-sensing pattern 6732, the seventh sub-sensing pattern 6733 and the eighth sub-sensing pattern 6734 may each be electrically connected to a driver chip TIC by separate lines. For example, the fifth sub-sensing pattern 6731 may be connected to a driver chip connection portion 683 by a third sub-connection line 6931, and the sixth sub-sensing pattern 6732 may be connected to the driver chip connection portion 683 by a fourth sub-connection line 6932 separated from the third sub-connection line 6931. The seventh sub-sensing pattern 6733 and the eighth sub-sensing pattern 6734 may each be connected to the driver chip connection portion 683 by separate sub-connection lines. The driver chip TIC may independently obtain a capacitance from each of the fifth sub-sensing pattern 6731, the sixth sub-sensing pattern 6732, the seventh sub-sensing pattern 6733 and the eighth sub-sensing pattern 6734 and may determine which part of the pressure sensor 900 has been lifted or peeled based on the obtained capacitance.

However, the present invention is not limited to the above description, and the number of sub-sensing patterns included in the second sensing pattern 673*a* and the arrangement of the sub-sensing patterns may be variously changed.

Figure 25:
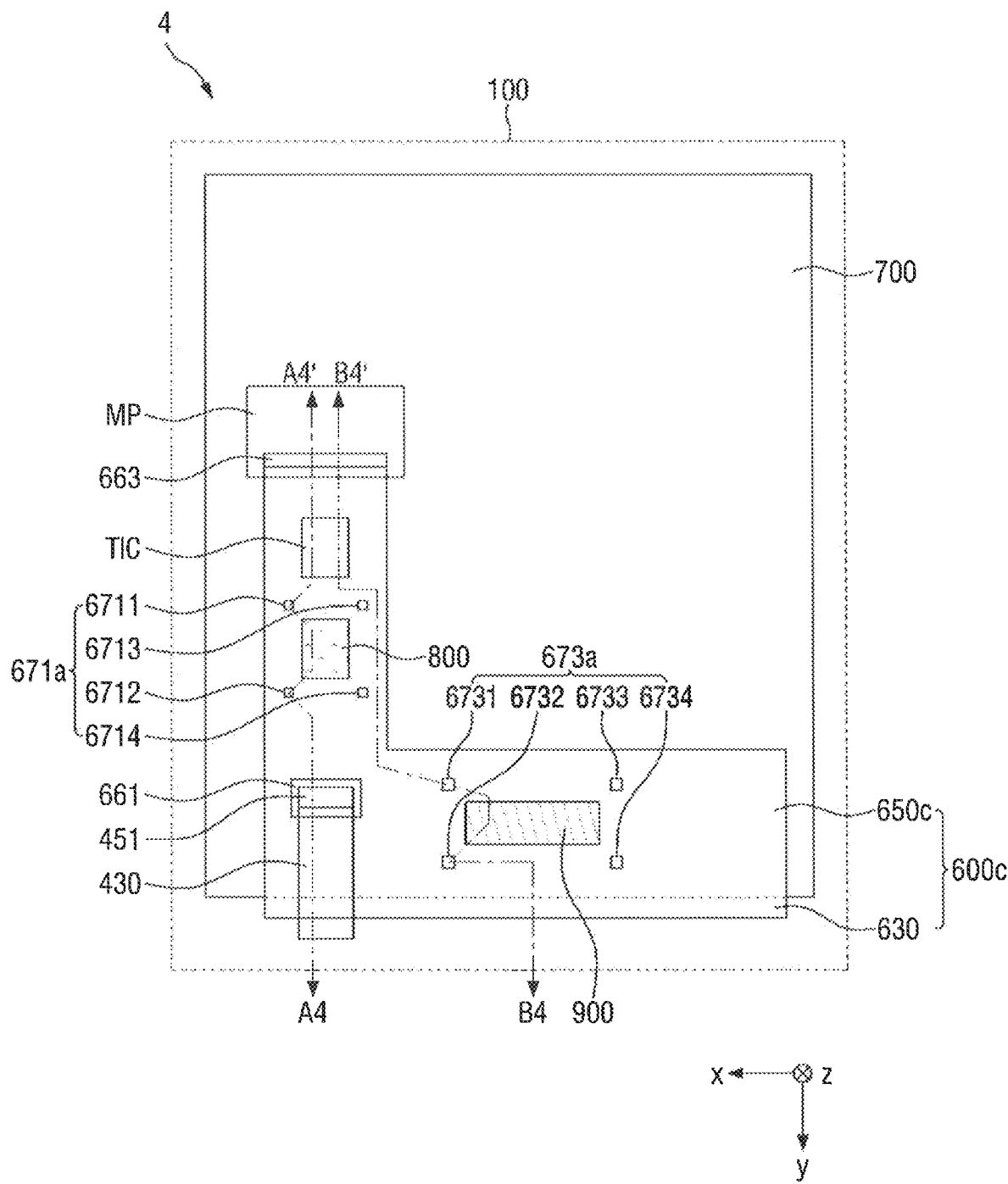
FIG. 25 is a rear view of a display device according to an exemplary embodiment of the present invention.

FIG. 25 is a rear view of a display device 4 according to an exemplary embodiment of the present invention. Referring to FIG. 25, the display device 4 according to an exemplary embodiment of the present invention is substantially the same as the display device 1 described above with reference to FIGS. 1 through 18, except that it includes a first FPCB 600*c*. In addition, the first FPCB 600*c* is substantially the same or similar to the first FPCB 600 of the display device 1, except that a second substrate portion 650*c* includes a first sensing pattern 671*a* and a second sensing pattern 673*a*. The first sensing pattern 671*a* is the same as that described above with reference to FIGS. 19 through 21, and a cross-section along line A4-A4' may be substantially the same as the structure illustrated in FIG. 20. The second sensing pattern 673*a* is the same as that described above with reference to FIGS. 22 through 24, and a cross-section along B4-B4' may be substantially the same as the structure illustrated in FIG. 24. Therefore, a detailed description may be omitted.

According to an exemplary embodiment of the present invention, a lifting of an element of a display device can be easily detected. Therefore, a defect rate of the display device can be reduced in the manufacturing process, and the maintenance of the display device can be easily performed in the process of using the display device.

In an exemplary embodiment of the present invention, a first sensing pattern, a coupling portion, a second sensing pattern, and a pressure sensor are all provided. However, in an exemplary embodiment of the present invention, of the first sensing pattern, the coupling portion, the second sensing pattern and the pressure sensor, the first sensing pattern or the second sensing pattern may be omitted. In addition, in an exemplary embodiment of the present invention, the first sensing pattern and the coupling portion may be omitted, or the second sensing pattern and the pressure sensor may be omitted.

According to an exemplary embodiment of the present invention, it is possible to provide a display device capable of detecting lifting or separation of an FPCB.

According to an exemplary embodiment of the present invention, it is possible to provide an FPCB including a sensing pattern for detecting lifting or separation.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A display device comprising:
 a display panel;
 a conductive layer disposed under the display panel;
 a first flexible printed circuit board comprising a first substrate portion having a side connected to the display panel, a bending portion extending from the first substrate portion, and a second substrate portion extending from the bending portion and disposed under the conductive layer, wherein the first substrate portion overlaps the display panel, and the second substrate portion comprises a first sensing, pattern overlapping the conductive layer, a driver chip connection portion spaced apart from the first sensing pattern, and a first connection line electrically connecting the first sensing pattern and the driver chip connection portion to each other;
 a coupling portion disposed between the second substrate portion and the conductive layer and coupling the second substrate portion and the conductive layer together, wherein the coupling portion is adjacent to the first sensing pattern; and
 a driver chip mounted on the second substrate portion and electrically connected to the driver chip connection portion.

2. The display device of claim 1, wherein the first sensing pattern at least partially surrounds the coupling portion.

3. The display device of claim 1, wherein the first sensing pattern comprises a plurality of sub-sensing patterns disposed adjacent to the coupling portion, wherein the plurality of sub-sensing patterns are spaced apart from each other.

4. The display device of claim 1, wherein the driver chip is configured to detect a capacitance between the conductive layer and the first sensing pattern.

5. The display device of claim 4, wherein the driver chip is configured to detect whether the coupling portion has been separated from either the second substrate portion or the conductive layer based on the capacitance between the conductive layer and the first sensing pattern.

6. The display device of claim 4, further comprising:
 a touch sensing unit disposed on the display panel; and
 a second flexible printed circuit board including a first side connected to the touch sensing unit and a second side connected to the second substrate portion.

7. The display device of claim 6, wherein the driver chip is configured to control an operation of the touch sensing unit.

8. The display device of claim 1, wherein the first flexible printed circuit board further comprises a ground portion electrically connected to the conductive layer.

9. The display device of claim 8, wherein the coupling portion includes a conductive adhesive tape, and
 wherein the coupling portion contacts the ground portion and the conductive layer.

10. The display device of claim 9, wherein the main circuit board is configured to control the display panel to perform a predetermined operation when the coupling portion is separated from either the conductive layer or the second substrate portion.

11. The display device of claim 1, further comprising a main circuit board connected to the first flexible printed circuit board, wherein the main circuit board is electrically connected to the driver chip.

12. The display device of claim 1, further comprising a pressure sensor disposed between the second substrate portion and the conductive layer, coupled to the second substrate portion and the conductive layer, and spaced apart from the coupling portion, wherein the second substrate portion further comprises a second sensing pattern disposed adjacent to the pressure sensor and electrically connected to the driver chip, and the driver chip is further configured to detect a capacitance between the conductive layer and the second sensing pattern.

13. The display device of claim 12, wherein the first flexible printed circuit board further comprises a second connection line spaced apart from the first connection line and electrically connected to the second sensing pattern and the driver chip.

14. The display device of claim 13, wherein the first flexible printed circuit board further comprises a sensor connection line electrically connected to the pressure sensor and the driver chip and spaced apart from the first connection line and the second connection line.

15. The display device of claim 13, wherein the second sensing pattern at least partially surrounds the pressure sensor.

16. The display device of claim 13, wherein the second sensing pattern comprises a plurality of sub-sensing patterns disposed adjacent to the pressure sensor, wherein the plurality of sub-sensing patterns are spaced apart from each other.

17. The display device of claim 16, further comprising a touch sensing unit disposed on the display panel, wherein the driver chip is electrically connected to the touch sensing unit and is configured to control an operation of the touch sensing unit.

18. A display device comprising:
a display panel;
a conductive layer disposed on the display panel;
a flexible printed circuit board comprising a first substrate portion having a side connected to the display panel, a second substrate portion disposed under the conductive layer, and a bending portion connecting the first substrate portion and the second substrate portion to each other, wherein the first substrate portion overlaps the display panel, and the second substrate portion comprises a sensing pattern overlapping the conductive layer, a driver chip connection portion spaced apart from the sensing pattern, and a connection line electrically connecting the first sensing pattern and the driver chip connection portion to each other;
a pressure sensor disposed between the second substrate portion and the conductive layer, wherein the pressure sensor is adjacent to the sensing pattern, and is coupled to the second substrate portion and the conductive layer; and
a driver chip mounted on the second substrate portion and electrically connected to the driver chip connection portion.

19. The display device of claim 18, wherein the driver chip is configured to detect a capacitance between the conductive layer and the sensing pattern, and
wherein the driver chip is electrically connected to the pressure sensor and is configured to control an operation of the pressure sensor.

20. The display device of claim 19, wherein the driver chip is configured to detect whether the pressure sensor has been separated from either the second substrate portion or the conductive layer based on the capacitance between the conductive layer and the sensing pattern.

* * * * *